United States Patent
Avanzino et al.

(10) Patent No.: US 7,232,765 B1
(45) Date of Patent: Jun. 19, 2007

(54) UTILIZATION OF A TA-CONTAINING CAP OVER COPPER TO FACILITATE CONCURRENT FORMATION OF COPPER VIAS AND MEMORY ELEMENT STRUCTURES

(75) Inventors: Steven C. Avanzino, Cupertino, CA (US); Nicholas H. Tripsas, San Jose, CA (US); Jeffrey A. Shields, Sunnyvale, CA (US); Fei Wang, San Jose, CA (US); Richard P. Kingsborough, Acton, MA (US); William Leonard, Brookline, MA (US); Suzette K. Pangrle, Cupertino, CA (US)

(73) Assignees: Spansion LLC, Sunnyvale, CA (US); Advanced Micro Devices, Inc., Austin, TX (US)

( * ) Notice: Subject to any disclaimer, the term of this patent is extended or adjusted under 35 U.S.C. 154(b) by 234 days.

(21) Appl. No.: 10/988,239

(22) Filed: Nov. 12, 2004

(51) Int. Cl.
H01L 21/302 (2006.01)
H01L 21/461 (2006.01)

(52) U.S. Cl. ............... 438/705; 438/687; 438/780; 257/E21.293

(58) Field of Classification Search ............ 438/99, 438/705; 257/E21.293
See application file for complete search history.

(56) References Cited

U.S. PATENT DOCUMENTS

| | | | |
|---|---|---|---|
| 6,656,763 B1 | 12/2003 | Oglesby et al. | |
| 6,686,263 B1 | 2/2004 | Lopatin et al. | |
| 6,746,971 B1 | 6/2004 | Ngo et al. | |
| 6,753,247 B1 | 6/2004 | Okoroanyanwu et al. | |
| 6,768,157 B2 | 7/2004 | Krieger et al. | |
| 6,770,905 B1 | 8/2004 | Buynoski et al. | |
| 6,773,954 B1 | 8/2004 | Subramanian et al. | |
| 6,781,868 B2 | 8/2004 | Bulovic et al. | |
| 6,787,458 B1* | 9/2004 | Tripsas et al. ............ 438/652 |
| 6,803,267 B1 | 10/2004 | Subramanian et al. | |
| 6,806,526 B2 | 10/2004 | Krieger et al. | |
| 6,870,183 B2* | 3/2005 | Tripsas et al. ............ 257/40 |
| 6,900,488 B1* | 5/2005 | Lopatin et al. ............ 257/295 |
| 6,979,837 B2* | 12/2005 | Tripsas et al. ............ 257/40 |
| 2006/0046502 A1* | 3/2006 | Ngo et al. ............ 438/757 |
| 2006/0102887 A1* | 5/2006 | Avanzino et al. ............ 257/2 |

* cited by examiner

Primary Examiner—B. William Baumeister
Assistant Examiner—Igwe U. Anya
(74) Attorney, Agent, or Firm—Amin, Turocy & Calvin, LLP

(57) ABSTRACT

Disclosed are methods for facilitating concurrent formation of copper vias and memory element structures. The methods involve forming vias over metal lines and forming copper plugs, wherein the copper plugs comprise memory element film forming copper plugs (memE copper plugs) and non-memory element forming copper plugs (non-memE copper plugs), forming a tantalum-containing cap over an upper surface of non-memE copper plugs, and depositing memory element films. The tantalum-containing cap prevents the formation of the memory element films in the non-memE copper plugs. The subject invention advantageously facilitates cost-effective manufacturing of semiconductor devices.

20 Claims, 21 Drawing Sheets

UTILIZATION OF A TA-CONTAINING CAP OVER COPPER TO FACILITATE CONCURRENT FORMATION OF COPPER VIAS AND MEMORY ELEMENT STRUCTURES

TECHNICAL FIELD

The subject invention generally relates to semiconductor fabrication. More particularly, the subject invention relates to methods and systems for concurrent formation of copper vias and memory element structures in a copper layer.

BACKGROUND ART

Much of the progress in making computers and memory devices faster, smaller and less expensive involves integration, squeezing ever more transistors and other electronic structures onto a postage stamp sized piece of silicon. A postage stamp sized piece of silicon may contain tens of millions of transistors, each transistor as small as a few hundred nanometers. The escalating requirements for high density and performance associated with ultra large-scale integration require responsive changes in semiconductor technology.

Semiconducting devices include, among other components, a plurality of sequentially formed dielectric interlayers and conductive patterns. Typically, the conductive patterns in two layers, such as upper and lower layers, are electrically connected by a conductive plug filling a via hole, while a conductive plug filling a contact hole establishes electrical contact with an active region on a semiconductor substrate. The increasing complexity of semiconducting devices demands more effective metallization methods and materials.

In recent years copper (Cu) is emerging as an alternative to aluminum (Al) for metallization patterns, particularly for interconnect systems having smaller dimensions. Some of the benefits of Cu include low resistivity, resistance to electromigration, and stress avoiding properties. Despite the beneficial properties, Cu usage in large-scale semiconductor manufacturing raises some concerns, which need to be addressed.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention can provide advantageous features and/or improvements compared to conventional methods of forming copper (Cu) interconnect structures for semiconductor fabrication. The subject invention facilitates concurrent formation of both memory element structures and Cu vias in a Cu layer by preventing formation of memory element films on Cu plugs or metal interconnect lines having a tantalum (Ta)-containing cap layer. Thus, the subject invention provides for one or more of the following: reduced manufacturing costs, reduced process times, improved device reliability, and improved performance of semiconductor devices. The Cu plugs formed in vias may be used to form either memory element structures (memE Cu plugs) or for other purposes, such as for forming Cu vias (non-memE Cu plugs).

According to one aspect of the invention, methods are provided for concurrent formation of memory element structures and Cu vias in a Cu layer. The methods involve forming vias over metal lines and filling the vias to form Cu plugs, forming a Ta-containing cap layer over upper surfaces of non-memE Cu plugs or metal lines that do not receive memory element films, and depositing memory element films. The Ta-containing cap layer prevents the formation of memory element films.

According to another aspect of the invention, methods are provided which involve forming vias over metal lines and filling the vias to form Cu plugs, forming memory element films on substantially all Cu plugs, depositing a first Ta-containing cap layer substantially over all memory element films, protecting the memE Cu plugs with an etch mask, removing the first Ta-containing cap layer and memory element films from non-memE Cu plugs, depositing a second Ta-containing cap layer, depositing a conductive material, and patterning memory element films and Cu vias.

In a further aspect of the subject invention, methods are provided which involve forming a metal line, recessing a portion of the metal line, forming a Ta-containing cap layer in the recessed portion of the metal line, patterning vias in a dielectric layer deposited over the metal line, depositing memory element films in vias with no Ta-containing cap at the bottom surface, filling vias containing the Ta-containing cap at the bottom surface with a metal, and patterning memory element films and non-memE Cu vias.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

Figure 1:
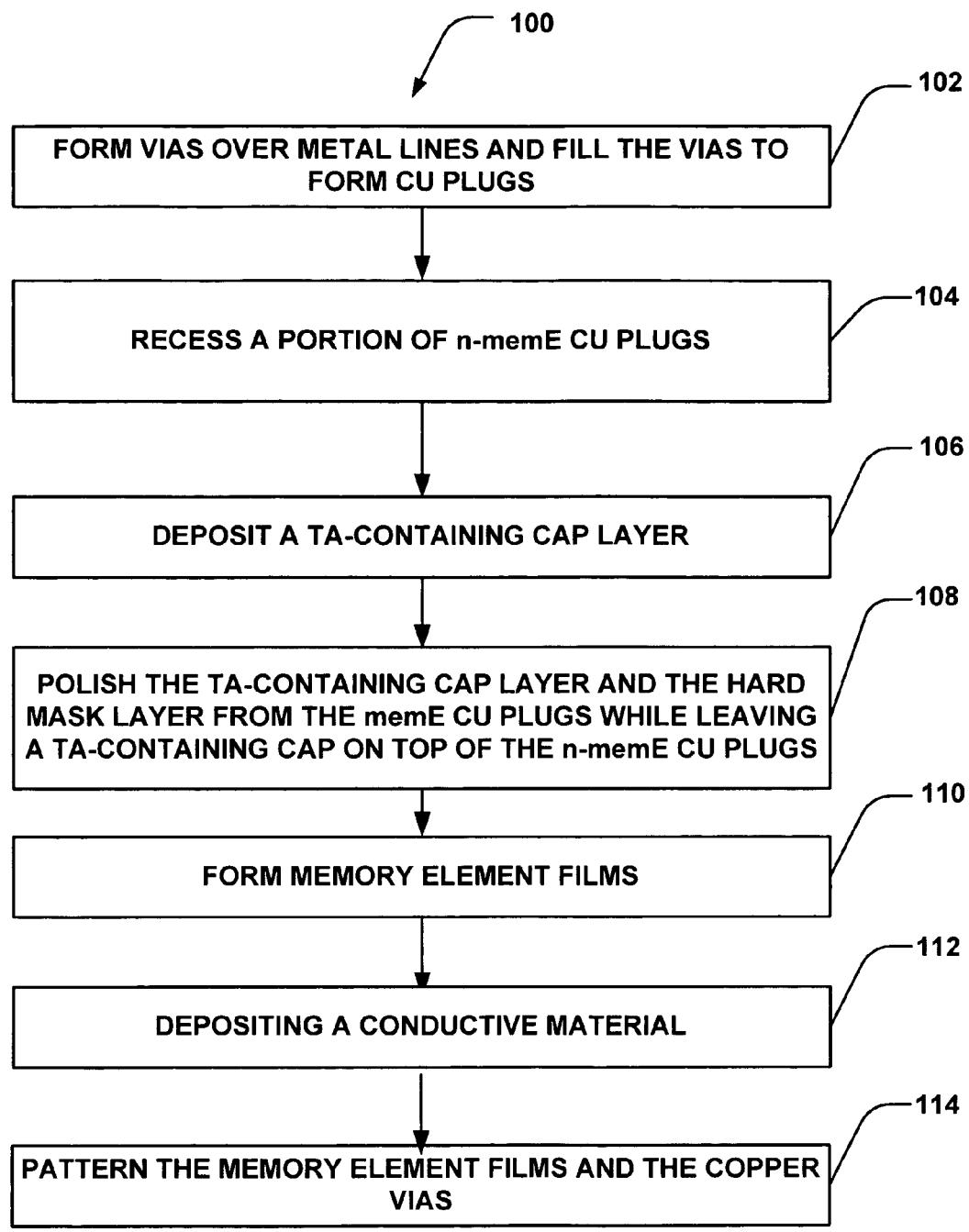
FIG. 1 is a flow chart illustrating an exemplary methodology for carrying out one aspect of the subject invention.

During semiconductor fabrication Cu plugs formed in vias are typically used for different purposes. For example, some Cu plugs can be used for forming memory element structures and some others can be used for purposes such as forming metal interconnects. In the context of the subject invention, the term "memE Cu plugs" is used as a brief descriptor for Cu plugs used for forming memory element structures, and the term "non-memE Cu plugs" is used as a brief descriptor for Cu plugs used for other purposes. The subject invention relates to methods that facilitate concurrent formation of both memory element structures and Cu vias using Cu plugs formed in vias patterned in a Cu layer. The methods involve using a tantalum (Ta) containing cap layer over upper surfaces of non-memE Cu plugs or portions of metal lines that do not receive memE Cu plugs. The inventors have observed that, in general, the Ta-containing cap layer prevents memory element formation and, thus, permits fabrication of both memory element structures and copper vias using Cu plugs formed in a Cu layer.

The invention utilizes a Ta-containing cap to facilitate concurrent formation of both memory element structures and Cu vias on Cu plugs formed in a Cu layer. The concurrent fabrication can decrease process cost, and reduce process requirements. It is believed that the Ta-containing cap prevents formation of memory element films because the Ta-containing cap provides a relatively poor adhesive surface for formation of memory element films, such as copper sulfide. The formation of memory element films also seemingly requires an exposed copper surface, and the Cu plug surfaces with a Ta-containing cap do not provide exposed copper surfaces, thereby preventing the formation of memory element films on Cu plugs and metal interconnect lines with a Ta-containing cap.

For the subject invention, typically, a Ta-containing cap layer is formed over the upper surfaces of non-memE Cu plugs or metal lines on which non-memE Cu plugs are formed. The Ta-containing cap layer is processed suitably to produce a Ta-containing cap. Memory element films are deposited over all Cu plugs but, generally the Ta-containing cap of the invention prevents formation of memory element films on surfaces containing a Ta-cap.

The Ta-containing cap layer of the subject invention may include any Ta-containing materials. For example, the Ta-containing cap layer can be formed using alpha Ta, beta Ta, alpha-beta Ta, compounds of Ta, alloys of Ta, and combinations thereof. Examples of compounds of Ta include Ta nitride, Ta carbide, Ta oxide, Ta sulfide, and the like. In one embodiment of the subject invention, the Ta-containing cap layer includes alpha Ta. In another embodiment of the subject invention, the Ta-containing cap layer can include tantalum-tungsten, tantalum-titanium and the like.

The Ta-containing cap layer of the subject invention can be formed using techniques well known to a person skilled in the art. For example, the Ta-containing cap layer of the subject invention can be formed by deposition techniques such as chemical vapor deposition (CVD), physical vapor deposition (PVD), plasma enhanced chemical vapor deposition (PECVD), low pressure chemical vapor deposition (LPCVD), high pressure chemical vapor deposition (HPCVD), sputtering, evaporation, electroplating and the like.

The Ta-containing cap of the subject invention can be of any suitable thickness. In one embodiment of the subject invention, the Ta-containing cap of the subject invention can have a thickness from about 1 Å to about 200 Å. In another embodiment, the thickness of the Ta-containing cap is from about 5 Å to about 50 Å. In yet another embodiment of the subject invention, the Ta-containing cap has a thickness from about 20 Å to about 40 Å.

The Ta-containing cap layer may be formed during various stages of fabrication, and still achieve the advantages of the subject invention. In one embodiment of the subject invention, the Ta-containing cap layer may be formed over a recessed part of a metal line before forming vias. In another embodiment of the subject invention, the Ta-containing cap layer may be formed in a recessed portion of memE Cu plugs before the formation of memory element films. In yet another embodiment of the subject invention, the Ta-containing cap layer may be formed over the Cu plugs after the formation of memory element films.

The subject invention as described can provide for fabrication of semiconductor devices exhibiting improved efficiency. The subject invention achieves these advantages by exploiting the beneficial properties of tantalum to form memory element films on memE Cu plugs while preventing formation of memory element films over non-memE Cu plugs.

The subject invention may be understood and its advantages appreciated in conjunction with the figures and drawings, wherein like numerals represent like features throughout. For simplicity of explanation, the methods are depicted and described as a series of acts. Also, the drawings and figures are for illustrative purposes only and as such do not represent drawings and figures drawn to a scale. It is to be understood and appreciated that the subject invention is not limited by the acts illustrated and/or by the order of acts, for example acts can occur in various orders and/or concurrently, and with other acts not presented and described herein. Furthermore, not all illustrated acts may be required to implement the methodologies in accordance with the subject invention. In addition, those skilled in the art will understand and appreciate that the methodologies could alternatively be represented as a series of interrelated states via a state diagram or events.

Referring to FIG. 1, a flow chart of an exemplary methodology 100 for carrying out an aspect of the subject invention is shown. The method 100 involves forming vias over metal lines formed on a semiconductor substrate of a semiconductor device and filling the vias to form Cu plugs (act 102), depositing a hard mask layer over substantially all upper surfaces of Cu plugs and recessing a portion of non-memE Cu plugs (act 104), depositing a Ta-containing cap layer (act 106), polishing the Ta-containing cap layer and the hard mask from memE Cu plugs while leaving a Ta-containing cap on top of memE Cu plugs (act 108), forming memory element films (act 110), depositing a conductive material (act 112), and patterning memory element films and Cu vias (act 114).

Referring to 1, act 102 of method 100 is forming vias over metal lines formed on a semiconductor substrate. The semiconductor substrate on which metal lines can be formed includes any substrate used in the course of semiconductor processing or any semiconductor surface. The substrate can be formed using methods known to one skilled in the art. Examples of substrates for the subject invention include semiconductor materials such as gallium arsenide (GaAs), germanium, silicon, silicon germanium, lithium niobate, and compositions containing silicon such as crystalline silicon, polysilicon, amorphous silicon, epitaxial silicon, silicon dioxide ($SiO_2$), and combinations thereof. Typically, the substrate is a silicon substrate, optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The substrate is not shown in the figures and drawings for simplification and brevity.

Optionally, a barrier layer may be formed over portions of the substrate of the subject invention where subsequently metal lines are formed. Any barrier metal can be used for forming the barrier layer. For example, tantalum, tantalum nitride, tungsten, tungsten nitride, titanium, titanium nitride and combinations thereof may be used to form the barrier layer. The barrier layer may be formed using suitable deposition techniques that are well known to persons skilled in the art.

Metal lines can be formed on the substrate by any suitable technique. Examples of techniques for forming the metal lines include electroplating, electroless plating, sputtering, evaporation, CVD, PVD, spin-coating and the like. The metal lines can contain any Cu containing metal. The dimensions of the metal lines can vary depending on particular design needs, and still be within the scope of the subject invention.

In one instance, the formation of the metal lines may involve depositing a Cu seed layer over the semiconductor substrate which has been covered with a barrier layer, coating the semiconductor substrate and the Cu seed layer with a resist, patterning the resist coating, plating with copper, and stripping the resist to form the metal line.

The metal lines can also be formed by many other methods that are well known to persons skilled in the art. For example, the metal lines may be formed within openings defined by a dielectric layer. In another example, the metal lines may be formed without using a Cu seed layer. It is to be appreciated that other known methods of forming metal lines are within the scope of the subject invention. Optionally, the sidewalls of the metal lines can be coated with a suitable barrier layer.

A dielectric layer is formed over the metal lines. Any dielectric material can be used. Both organic and inorganic dielectric materials may be used. Similarly, both low and high k dielectrics may be used. Also polymeric, amorphous, crystalline and monomeric materials can be used as dielectric materials for this invention. Examples of dielectric materials include silicon containing spin-on glasses such as alkoxysilane polymer, a siloxane polymer, a silsesquioxane polymer, a poly(arylene ether), a fluorinated poly(arylene ether), other polymer dielectrics, nanoporous silica or mixtures thereof.

The dielectric layer can be formed by any suitable technique. For example, CVD, PECVD, or LPCVD, HPCVD methods can be used. Polymeric dielectrics can also be formed by using spin-coating, dip-coating, spraying, or roller coating.

The dielectric layer is deposited to a thickness appropriate to facilitate via formation and subsequent fabrication procedures. Typically, dielectrics are deposited to a thickness from about 1000 Å to about 50,000 Å.

Optionally, the dielectric layer may be heated. Heating of the dielectric layer may be conducted at a temperature from about 80° C. to about 500° C. The duration of heating of the dielectric layer may range from about 1 minute to about 10 hrs.

Via openings are patterned in the dielectric layer such that the via openings contacts the upper surfaces of the metal lines. Standard lithographic techniques can be used to form the via openings. The via openings can have relatively vertical sidewalls which extend perpendicular to the topological surface of the dielectric layer.

The via openings are filled with conductive materials such as metals and alloys of metals to form plugs. In one embodiment of the subject invention, the vias are filled with copper or alloys of copper to form Cu plugs. In another embodiment of the invention, the plugs contain at least Cu. The techniques for filling via openings are known to persons skilled in the art. For example, electroplating, electroless filling, sputtering, evaporation, deposition and the like can be used to fill vias.

In one example, the filling may include formation of a Cu seed layer. Once the Cu seed layer is formed the remainder of the Cu filling is completed using techniques such as evaporation, CVD, electroplating, electroless plating and the like. Optionally, the Cu seed layer may undergo a thermal annealing. Optionally, polishing and cleaning steps may be included to planarize the Cu to the level of the dielectric surface and remove any unwanted material from the metal surface.

Figure 2:
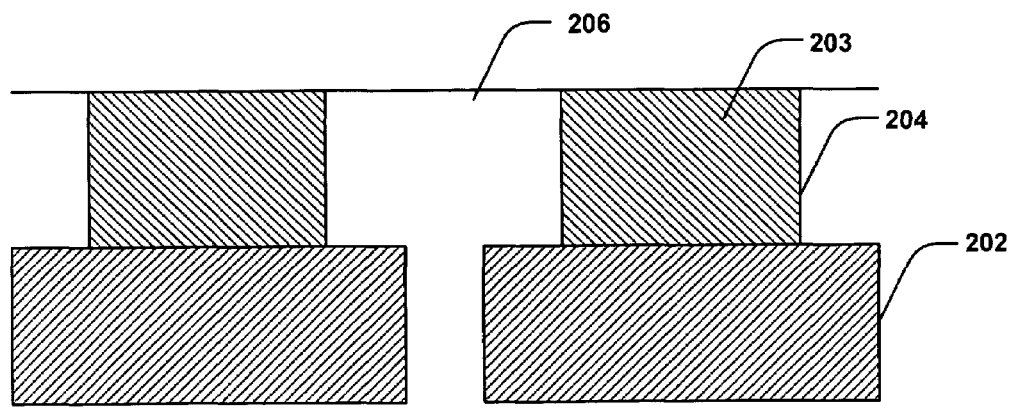
FIGS. 2–10 are cross sectional illustrations of a semiconductor substrate of a semiconductor device undergoing fabrication according to one aspect of the subject invention

FIG. 2 is a cross sectional illustration of Cu plugs 203 formed in patterned vias 204 formed over metal lines 202. FIG. 2 also shows a dielectric layer 206 in which the vias 204 are patterned.

Figure 3:
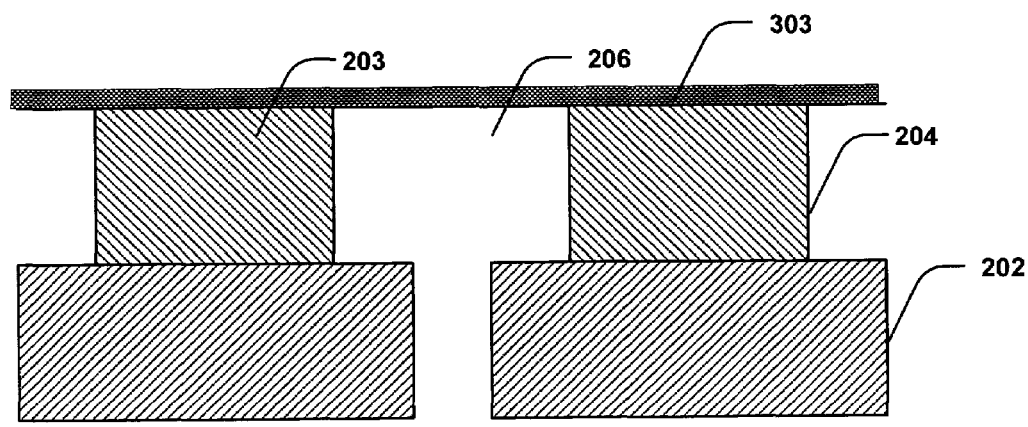

Referring back to FIG. 1, act 104 is providing a hard mask layer substantially over all upper surfaces of Cu plugs and the dielectric layer, and recessing a portion of copper metal from the non-memE Cu plugs. FIG. 3 is a cross sectional illustration of a semiconductor substrate undergoing fabrication according to method 100, showing the hard mask layer 303.

Any hard mask material can be used as the hard mask layer 303. For example, materials such as silicon nitride, silicon oxynitride, silicon oxide, silicon carbide, spin-on-glass (SOG), and the like can be used as the hard mask layer 303. The hard mask layer 303 is deposited using suitable methods. For example, the hard mask layer 303 can be deposited using CVD, PECVD and the like. Optionally, the hard mask layer 303 may be heated.

The hard mask layer 303 can be of suitable thickness to facilitate both protection of underlying areas and also further fabrication procedures. The thickness of the hard mask layer 303 can range from about 5 Å to about 1000 Å. Optionally, prior to forming the hard mask, blocking or etch stop layers can be formed over the surface of the dielectric layer containing vias.

Figure 4:
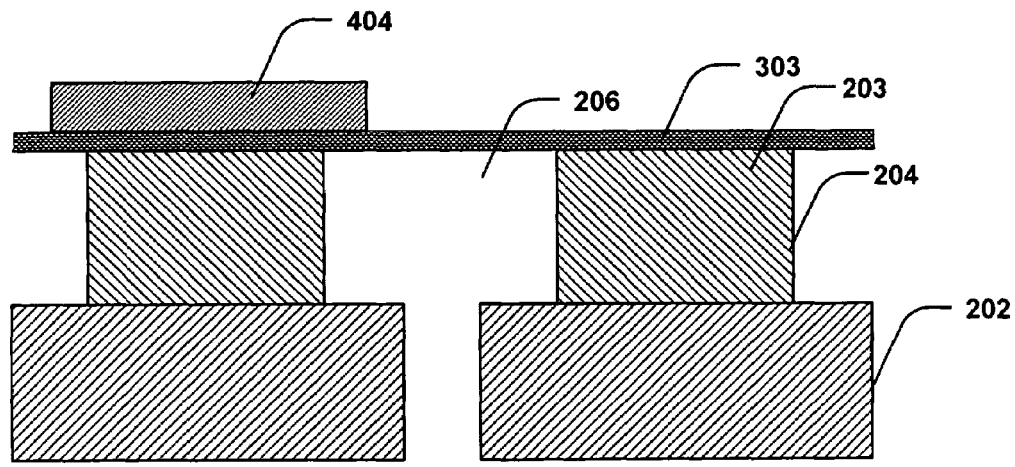

The recessing of the copper from non-memE Cu plugs can be done by any suitable technique that provides for controlled removal of copper. In one embodiment of the subject invention, recessing of the copper from non-memE Cu plugs can be carried out by using a resist as an etch mask to cover the hard mask surface area over the memE Cu plugs and then etching a portion of the Cu surface of the non-memE Cu plugs along with the hard mask layer. FIG. 4 shows a resist 404 over the hard mask layer 303. Any resist, both positive and negative, can be used. Resists are available from commercial suppliers and techniques for resist patterning are known to persons skilled in the art.

Either a wet etch or dry etch can be used to etch the hard mask layer 303 from areas not covered by the resist 404. Etching of the hard mask layer 303 is well known to persons skilled in the art.

The recessing of the copper from non-memE Cu plugs can be performed by any suitable technique. For example, etching can be used to recess Cu. Etching can be through either a wet etch or a dry etch. In one embodiment of the subject invention, the Cu recess is achieved by performing a plasma etch, wet etch, or electro polishing. In another embodiment of the subject invention, the Cu recess is formed using a reactive ion etching process. In yet another embodiment, the recess is formed by using a wet etchant in a spin-etch process. The etch may be followed by a cleaning act.

The etchant chemistry employed depends on the etch requirements. In one embodiment, a peroxide based etchant is used. In another embodiment, an acid based etchant is used. In yet another embodiment, an etchant containing both an acid and a peroxide is used. For example, a mixture of sulfuric acid and hydrogen peroxide can be used as a wet etchant. In one another embodiment, an etchant containing halogen compounds is used.

The etch rate can be adjusted to obtain proper etching. In one example, an etch rate from about 0.5 to about 10 µm/min is employed. The etching can be either isotropic or anisotropic. The temperature at which the etch is carried out ranges from about 10° C. to 100° C.

The amount of Cu to be recessed is determined by the thickness requirements of subsequently formed layers, such as memory element films and top electrode. In one embodiment, the recess is from about 1 Å to about 1000 Å in depth and is approximately from about 1/16 to about 1/4 the depth of the Cu vias 204. In another embodiment of the subject invention, the Cu is recessed to a depth from about 100 Å to about 750 Å. In yet another embodiment of the subject invention, the Cu is recessed to a level sufficient to form a cap layer.

Figure 5:
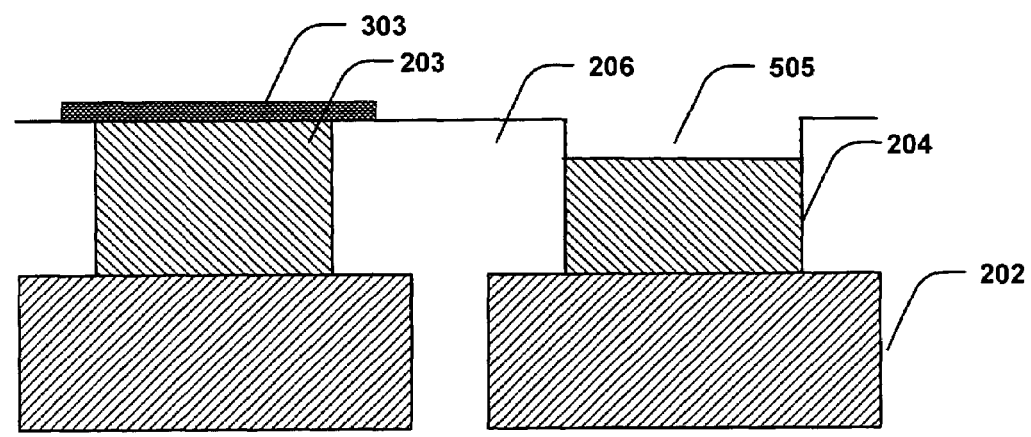

The resist 404 can be stripped using standard lithographic techniques leaving the hard mask layer 303 on memE Cu plugs. FIG. 5 is a cross sectional illustration of a semiconductor substrate undergoing fabrication according to one aspect of the invention and shows the recessed portion of the Cu 505.

Referring back to FIG. 1, act 106 of method 100 is depositing a Ta-containing cap layer substantially over the upper surface of the vias. The techniques and materials for depositing the Ta-containing material have been described previously and therefore, are not repeated here. The Ta-containing cap layer is deposited substantially over all the upper surfaces of the vias. The Ta-containing cap layer 606 covers both the recessed Cu plug areas 505 and the hard mask covered areas 303.

The thickness of the Ta-containing cap layer of the subject invention is controlled. In one embodiment of the subject invention, the Ta-containing cap layer can have a thickness from about 10 Å to about 1000 Å. In another embodiment of the subject invention, the thickness of the Ta-containing cap layer can be from about 25 Å to about 500 Å. In yet another embodiment of the subject invention, the Ta-containing cap layer can have a thickness of about 400 Å.

Figure 6:
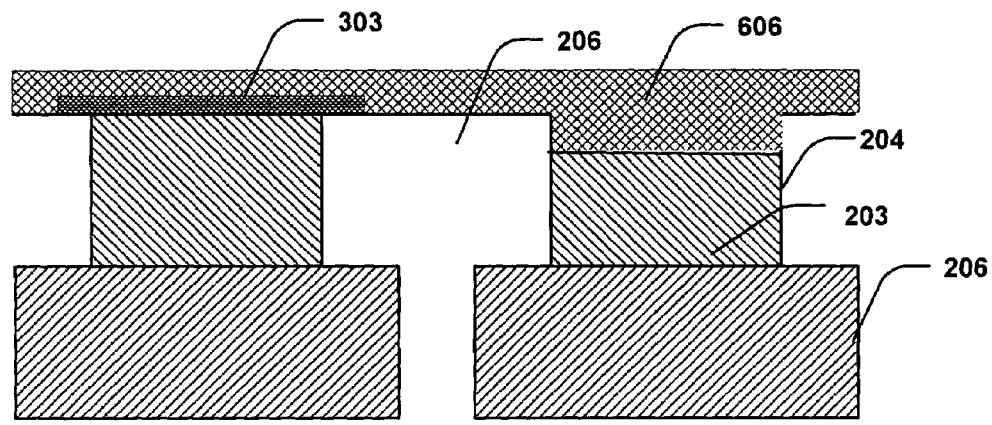

FIG. 6 is a cross sectional illustration of a semiconductor substrate undergoing fabrication according to method 100, showing a Ta-containing cap layer 606 over the surface of all vias including those which contain the hard mask layer 303.

Figure 7:
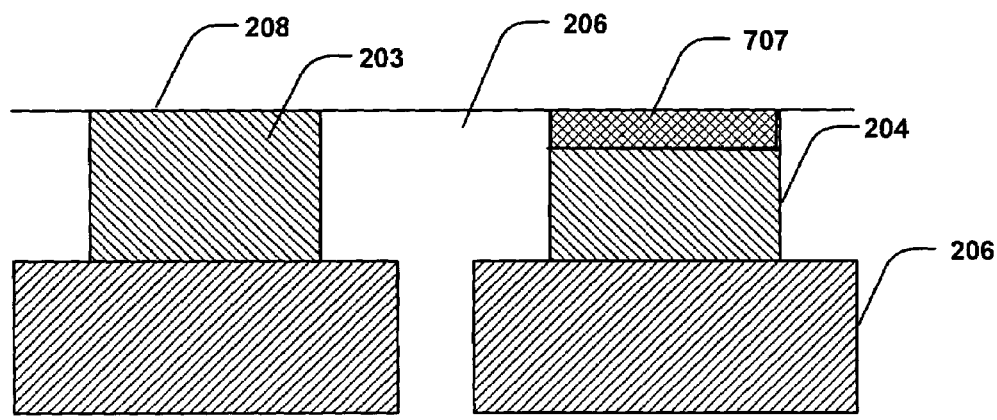

Referring back to FIG. 1, act 108 of method 100 is polishing the Ta-containing cap layer 606 and the hard mask layer 303 from the memE Cu plugs, and to form a damascened Ta-containing cap over the non-memE Cu plugs. The polishing results in a damascened Ta-containing cap 707 on the recessed surface of the non-memE Cu plugs along with a freshly exposed portion of the memE Cu plugs 208 as shown in FIG. 7.

The polishing can be performed using any suitable method. For example, chemical, mechanical, or chemical mechanical polishing (CMP) can be used. The polishing techniques are well known to persons skilled in the art. Typically, CMP utilizes a polishing slurry containing an abrasive and a chemically active component. CMP slurry is selected such that the slurry exhibits significantly different removal rates for at least two different materials. CMP equipment and slurry materials are commercially available, and can be used to produce the damascened Ta-containing cap of the subject invention.

The polishing is performed in such a way as to result in a damascened Ta-containing cap with appropriate thickness. For example, in one embodiment of the subject invention, the Ta-containing cap 707 can have a thickness from about 1 Å to about 200 Å. In another embodiment, the thickness of the Ta-containing cap 707 is from about 5 Å to about 50 Å. In yet another embodiment of the subject invention, the Ta-containing cap 707 has a thickness of about 20 Å.

Figure 8:
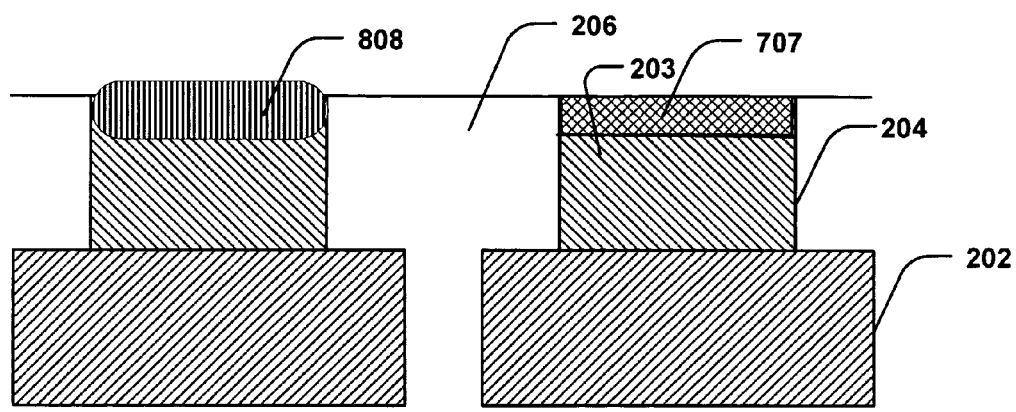

Referring back to FIG. 1, act 110 of method 100 is depositing memory element films in memE Cu plugs. The memory element films include a passive layer 808, and an active layer 909. FIG. 8 is a cross sectional illustration of a memory cell undergoing fabrication according to one aspect of the subject invention, showing the passive layer 808.

The passive layer 808 can be made of at least one conductivity facilitating compound. Examples of conductivity facilitating compounds that may constitute the passive layer 808 of the subject invention include one or more of Cu sulfide ($Cu_2S$, CuS), Cu rich Cu sulfide ($Cu_3S$, CuS; $Cu_3S$, $Cu_2S$), Cu oxide (CuO, $Cu_2O$), Cu selenide ($Cu_2Se$, CuSe), and Cu telluride ($Cu_2Te$, CuTe). Alternatively, the passive layer 808 may be formed using conductivity facilitating compounds such as manganese oxide ($MnO_2$), titanium dioxide ($TiO_2$), indium oxide ($I_3O_4$), silver sulfide ($Ag_2S$, AgS), gold sulfide ($Au_2S$, AuS), iron oxide ($Fe_3O_4$), cobalt arsenide ($CoAs_2$), nickel arsenide (NiAs), and the like.

The passive layer 808 is formed using oxidation techniques, via gas phase reactions, implantation techniques, or deposited. In some instances, the passive layer 808 may be treated with a plasma after it is formed. The plasma treatment modifies the energy barrier of the passive layer 808.

In one embodiment, the passive layer 808 containing the conductivity facilitating compound has a thickness of about 2 Å or more. In another embodiment, the passive layer 808 has a thickness of about 10 Å or more. In yet another embodiment, the passive layer 808 has a thickness of about 50 Å or more.

Figure 9:
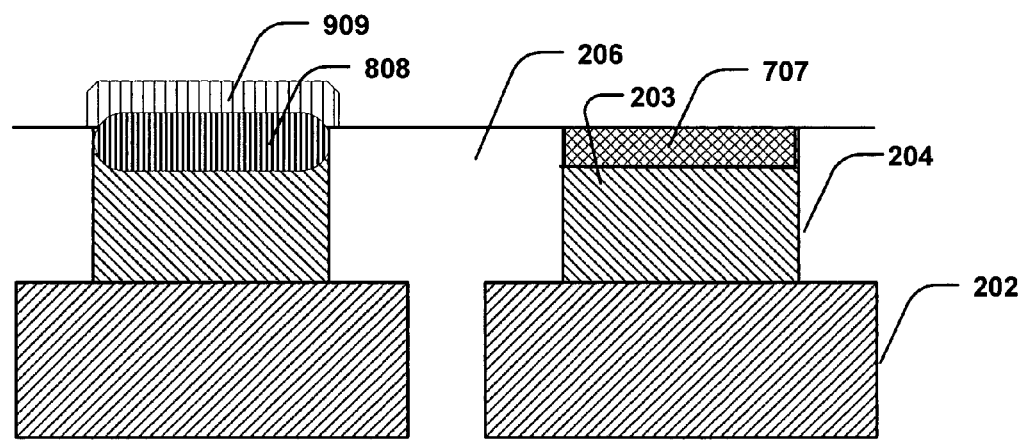

The active layer of the subject invention can be formed using any suitable low conducting material. FIG. 9 is a cross sectional illustration of a semiconductor device undergoing fabrication according to one aspect of the subject invention, showing an active layer 909 adjacent to the passive layer 808. Examples of materials that can be used in the formation of the active layer 909 include organic semiconducting materials, inorganic semiconducting materials, and mixtures of organic and inorganic semiconducting materials.

General examples of the organic semiconducting materials include at least one of an organic polymer (such as a conjugated organic polymer), an organometallic compound (such as a conjugated organometallic compound), an organometallic polymer (such as a conjugated organometallic polymer), a buckyball, a carbon nanotube (such as a C6–C60 carbon nanotubes), and the like.

General examples of the low conducting inorganic materials include transition metal sulfides, chalcogenides, and transition metal oxides. Examples of inorganic materials include copper oxide (CuO, $Cu_2O$), iron oxide (FeO, $Fe_3O_4$), manganese oxide ($MnO_2$, $Mn_2O_3$, etc), titanium oxide ($TiO_2$).

The active layer 909 can also contain a mixture of organic and inorganic materials. The inorganic material (transition metal oxide/sulfide) is usually embedded in an organic semiconductor material. Examples include polyphenylacetylene mixed with $Cu_2S$, polyphenylacetylene mixed with $Cu_2O$, and the like.

In one embodiment of the subject invention, the active layer 909 is a semiconducting polymer layer. The semiconducting polymer layer can contain one or more semiconducting polymers. The semiconducting polymer layer can be formed by spin-on techniques (depositing a mixture of the polymer/polymer precursor and a solvent, then removing the solvent from the substrate/electrode), by CVD, optionally including a gas reaction, gas phase deposition, and the like. CVD includes LPCVD, PECVD, and HDCVD. During formation or deposition, the polymer material may self assemble. It is not typically necessary to functionalize one or more ends of the organic polymer in order to attach it to an electrode/passive layer. Examples of semiconducting polymers include conjugated organic polymers, organometallic polymers, carbon structures such as carbon nanotubes and buckyballs, and the like.

Examples of conjugated organic polymers include one or more of poly(p-phenylene vinylene); polyporphyrins; porphyrinic macrocycles, thiol-derivatized polyporphyrins; polymetallocenes such as polyferrocenes, polyphthalocyanines; polyvinylenes; polystiroles; polyacetylene; poly-diphenylacetylene; poly(t-butyl)diphenylacetylene; poly(trifluoromethyl)diphenylacetylene; polybis(trifluoromethyl)acetylene; polybis(t-butyldiphenyl)acetylene; poly (trimethylsilyl) diphenylacetylene; poly(carbazole) diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)pheylacetylene; polydipyrrylmethane; polyindoqiunone; polydihydroxyindole; poly-trihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polyfluorenes, polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like.

Figure 10:
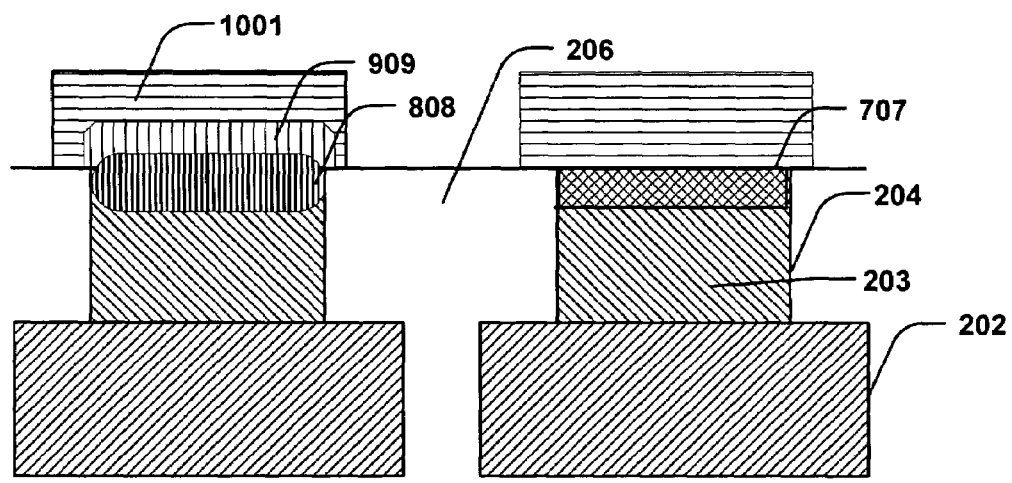

Referring back to FIG. 1, act 112 of method is depositing a conductive material over memory element films and Cu vias. FIG. 10 shows a cross sectional illustration of a semiconductor device with a conductive material 1001 formed over the memory element film 909 and the damascened Ta-containing cap 707. The conductive material 1001 may be formed by depositing metals using techniques such as etching, evaporation, PVD, CVD, and PECVD. Optionally, additional layers such as etch stop layers, cap layers, insulating layers, dielectric layers, and the like may be formed before depositing the conductive material 1001.

The conductive material 1001 can be any suitable material; such as a conductive metal, conductive metal alloys, conductive metal oxides, conductive polymer films, semiconductive materials, and the like. Specific examples of materials for the conductive material 1001 include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys.

The thickness and width of the conductive material 1001 may depend upon the specific lithography and design rules. In one embodiment, the thickness of the conductive material 1001 is about 0.01 μm or more and about 10 μm or less. In another embodiment, the thickness of the conductive material 1001 is about 0.05 μm or more and about 5 μm or less. In yet another embodiment, the thickness of the conductive material 1001 is about 0.1 μm or more and about 1 μm or less.

Referring back to FIG. 1, act 114 of method 100 is patterning memory element films and Cu vias. One skilled in the art would recognize that the conductive material 1001 over the memory element films can be patterned as an electrode and can be placed in a variety of positions without losing the advantages of the subject invention. Subsequent patterning to form wordlines, metal interconnects, circuitry and other structures required for the operation of the semiconductor devices can be carried out using standard procedures known to persons skilled in the art. Similarly, the conductive material over the damascened Ta-containing cap 707 can also be patterned in a variety of ways. The methods for patterning conductive material 1001 to form word lines, bit lines, interconnects, and the like are well known in the art and are not provided here for the sake of brevity.

Optionally, a diffusion barrier layer may be formed prior to formation of the conductive material 1001. The diffusion barrier can be of any thin conductive metal. In one embodiment of the subject invention, the diffusion barrier layer may be of titanium or titanium nitride. The thin conductive metal layer may be formed using any suitable technique. For example, CVD, PVD, evaporation, sputtering, and electro plating can be used. It is to be understood that the above acts of method 100 may be repeated to provide a series of suitable layers and conductive paths over one another on the substrate.

Operation of the devices/cells of the subject invention is facilitated using an external stimulus to achieve a switching effect. External stimuli include an external electric field and/or light radiation. Under various conditions, the polymer memory cell 1440 is either conductive (low impedance or "on" state) or non-conductive (high impedance or "off" state).

The active layer 909 along with the passive layer 808 comprises controllably conductive media. The controllably conductive media can be rendered conductive or non-conductive in a controllable manner using an external stimulus. Generally, in the absence of an external stimulus, the controllably conductive media is non-conductive or has high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, a semiconductive state, and resistive state(s) with various levels of resistance (in other words, the controllably conductive media may have a plurality of conductive states).

The subject invention advantageously provides for concurrent fabrication of memory element structures and Cu vias in a Cu layer. Thus, the subject invention can reduce processing time, and thereby, provide for more efficient and cost effective fabrication of semiconductor devices.

Figure 11:
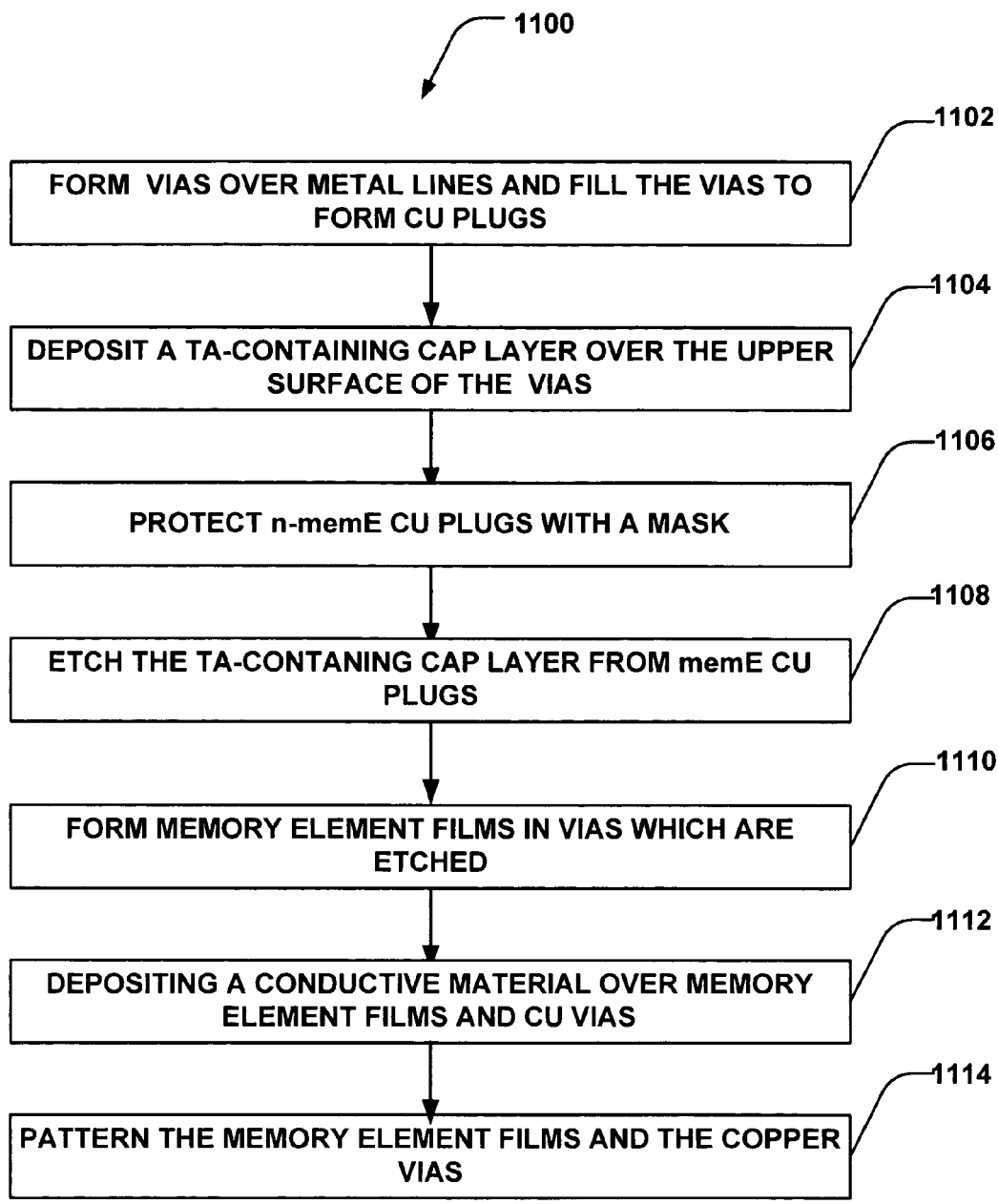
FIG. 11 is a flow chart illustrating an exemplary methodology for carrying out one aspect of the subject invention.

Referring to FIG. 11, a flow chart of an exemplary methodology 1100 for carrying out an aspect of the subject invention is shown. The method 1100 involves forming vias over metal lines and filling the vias to form Cu plugs (act 1102), depositing a Ta-containing cap layer over substantially all the upper surfaces of the vias (act 1104), protecting non-memE Cu plugs with an etch mask layer (act 1106), etching of the Ta-containing cap layer from the memE Cu plugs (act 1108), depositing memory element films (act 1110), depositing a conductive material over memory element films and Cu vias (act 1112), and patterning memory element films and Cu vias (act 1114). FIGS. 12–19 are cross sectional illustrations of a semiconductor substrate undergoing fabrication according one aspect of method 1100.

Figure 12:
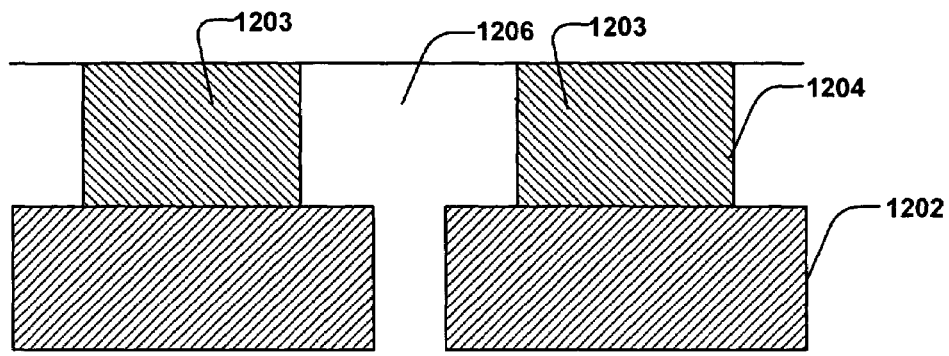
FIGS. 12–19 are cross sectional illustrations of a semiconductor substrate of a semiconductor device undergoing fabrication according to one aspect of the subject invention.

Referring to FIG. 11, act 1102 of method 1100 is forming vias over metal lines. The formation of metal lines 1202, vias 1204 and Cu plugs 1203 is similar both in technique and in material to the formation of the metal lines 202, the Cu vias 204, and the Cu plugs 203 described previously. FIG. 12 shows vias 1204 and Cu plugs 1203 formed on the metal lines 1202 in a dielectric layer 1206.

Figure 13:
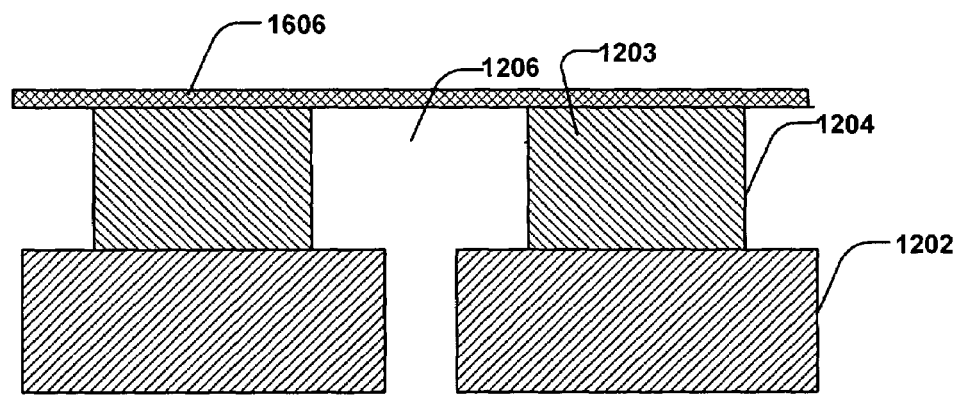

Referring back to FIG. 11, act 1104 of method 1100 is depositing a Ta-containing cap layer over substantially all upper surfaces of the vias 1204 and the upper surface of the dielectric layer 1206. The techniques and materials for depositing the Ta-containing cap layer 1606 are similar both in technique and material to the formation of the Ta-containing cap layer 606. FIG. 13 illustrates a Ta-containing cap layer 1606 over substantially all the entire upper surface of the vias 1204 and the upper surface of the dielectric layer 1206.

The Ta-containing cap layer 1606 is deposited to any suitable thickness. In one embodiment of the subject invention, the Ta-containing cap layer 1606 is deposited to a thickness from about 10 Å to about 1000 Å. In another embodiment of the subject invention, the thickness of the Ta-containing cap layer 1606 ranges from about 100 Å to about 600 Å. In yet another embodiment of the subject invention, the thickness of the Ta-containing cap layer 1606 is about 400 Å.

Figure 14:
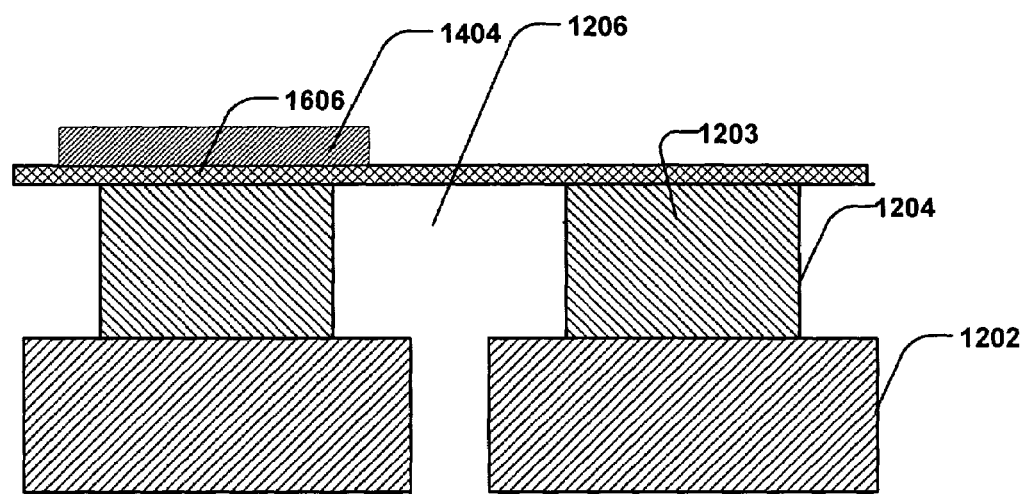

Referring back to FIG. 11, act 1106 of method 1100 is providing an etch mask over substantially all the upper surfaces of non-memE Cu plugs. Any suitable resist can be used as the etch mask. FIG. 14 shows a cross sectional depiction of a semiconductor substrate of act 1106 with a resist 1404 formed over the surfaces of non-memE Cu plugs. Any suitable resist can be used as the resist 1404. Resists are available commercially, and methods of forming the resist are known to a person skilled in the art.

Figure 15:
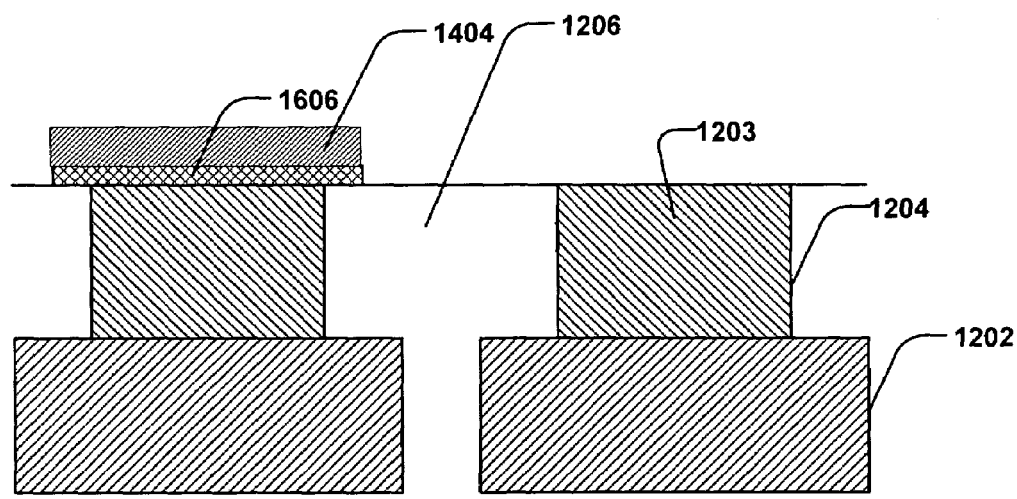

Referring back to FIG. 11, act 1108 is etching the Ta-containing cap layer 1606 from memE Cu plugs. The etching of the Ta-containing cap layer 1606 can be by any suitable etch technique. For example, both wet etch and plasma etch techniques can be used. The plasma etching can be a fluorine containing etch. FIG. 15 is a cross sectional illustration of a semiconductor substrate undergoing fabrication according to method 1100 and shows the resist 1404 over an unetched portion of the Ta-containing cap layer 1606.

The amount of the Ta-containing cap layer 1606 that has to be removed by etching is dependent on design and lithographic needs. In one embodiment of the subject invention, the Ta-containing cap layer 1606 is etched so that the upper surface of the Ta-containing cap layer is co-planar with the upper surface of the dielectric layer 1206.

Figure 16:
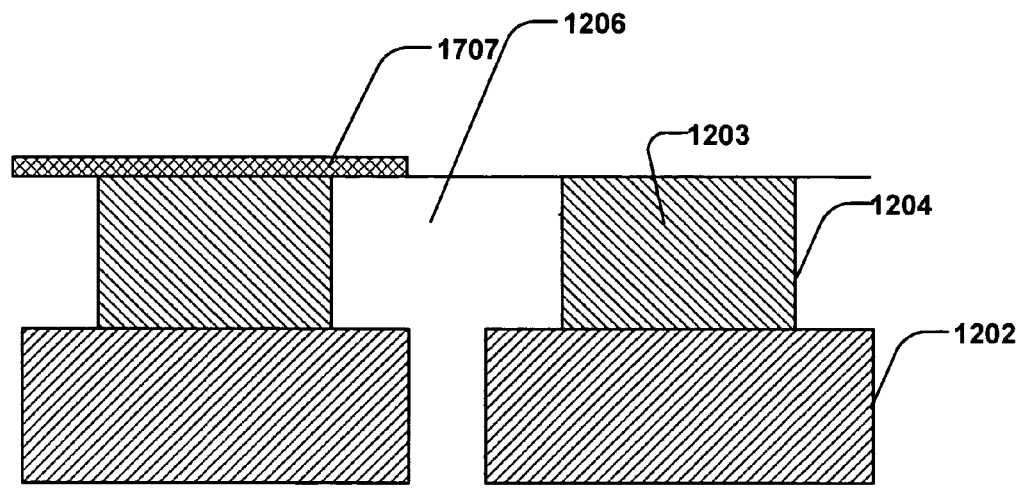

The resist 1404 is stripped using standard stripping techniques, leaving a Ta-containing cap 1707 over non-memE Cu plugs. In one example, the resist 1404 can be stripped using an oxygen containing plasma, $N_2/H_2$ containing plasma, or a wet solvent clean with a material such as ACT 970. In one embodiment of the subject invention both the etching of the Ta-containing cap layer 1606 and the stripping of the resist 1404 are performed in a single operation. In another embodiment of the subject invention, both the etching of the Ta-containing cap layer 1606 and the stripping of the resist 1404 are carried out separately. Optionally, the resist can be stripped after formation of memory element films. FIG. 16 is a cross sectional illustration of a semiconductor substrate that underwent a stripping and etching according to method 1100, showing the Ta-containing cap 1707.

Figure 17:
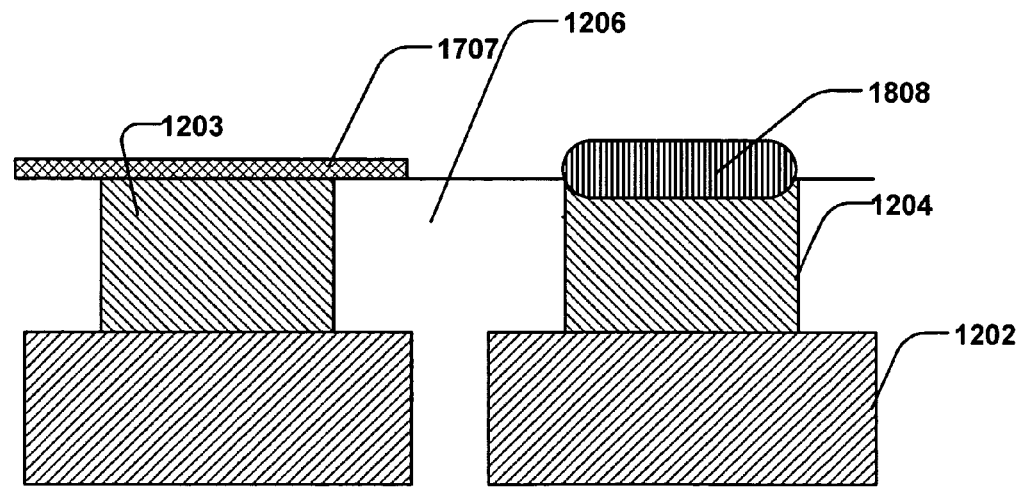
Figure 18:
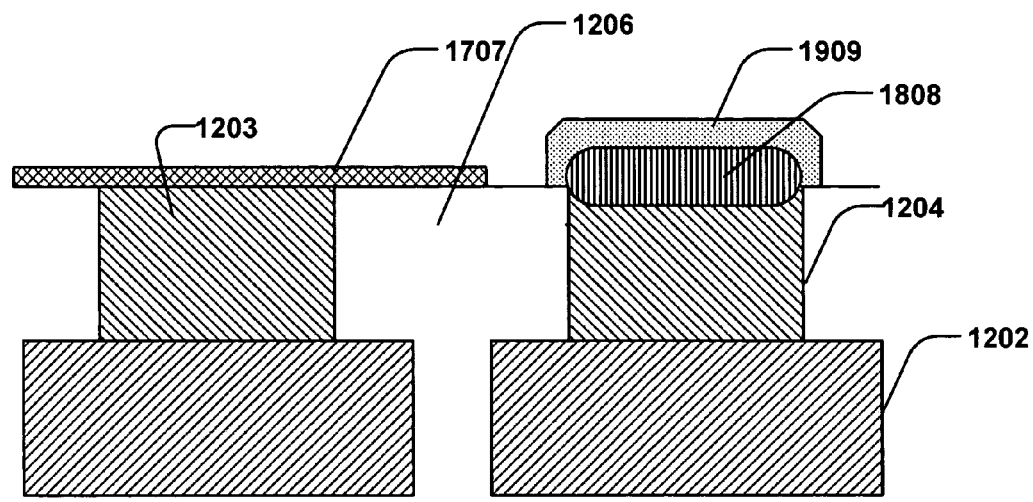

Referring back to FIG. 11, act 1110 is forming memory element films in memE Cu plugs. The memory element film formation is identical in both material and method to the memory element formation described for method 100, and therefore, not described here. FIGS. 17 and 18 depict a semiconductor substrate undergoing fabrication according to method 1100 and show memory element films, a passive layer 1808 (FIG. 17), and both a passive layer 1808 and an active layer 1909 (FIG. 18) formed over Cu plugs that did not have the Ta-containing cap 1707.

Figure 19:
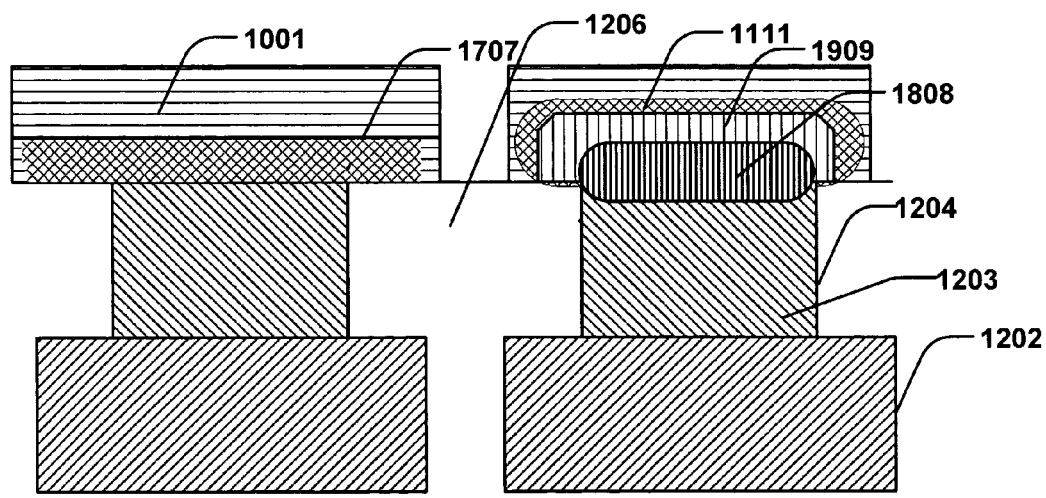

Referring back to FIG. 11, acts 1112 and 1114 are depositing a conductive material and pattering the memory element films and the Cu vias respectively. Acts 1112 and 1114 are similar in both technique and material to act 112 and 114 of method 100 except that in act 1112 an additional diffusion barrier layer 1111 is formed over memory element films before depositing conductive material 1001. The formation of the additional diffusion barrier layer is similar in technique and material to the optional diffusion barrier layer of act 112 of method 100. FIG. 19 is a cross sectional illustration of a semiconductor substrate undergoing fabrication according to method 1100 and shows a conductive material 1001 and a diffusion barrier layer 1111.

Figure 20:
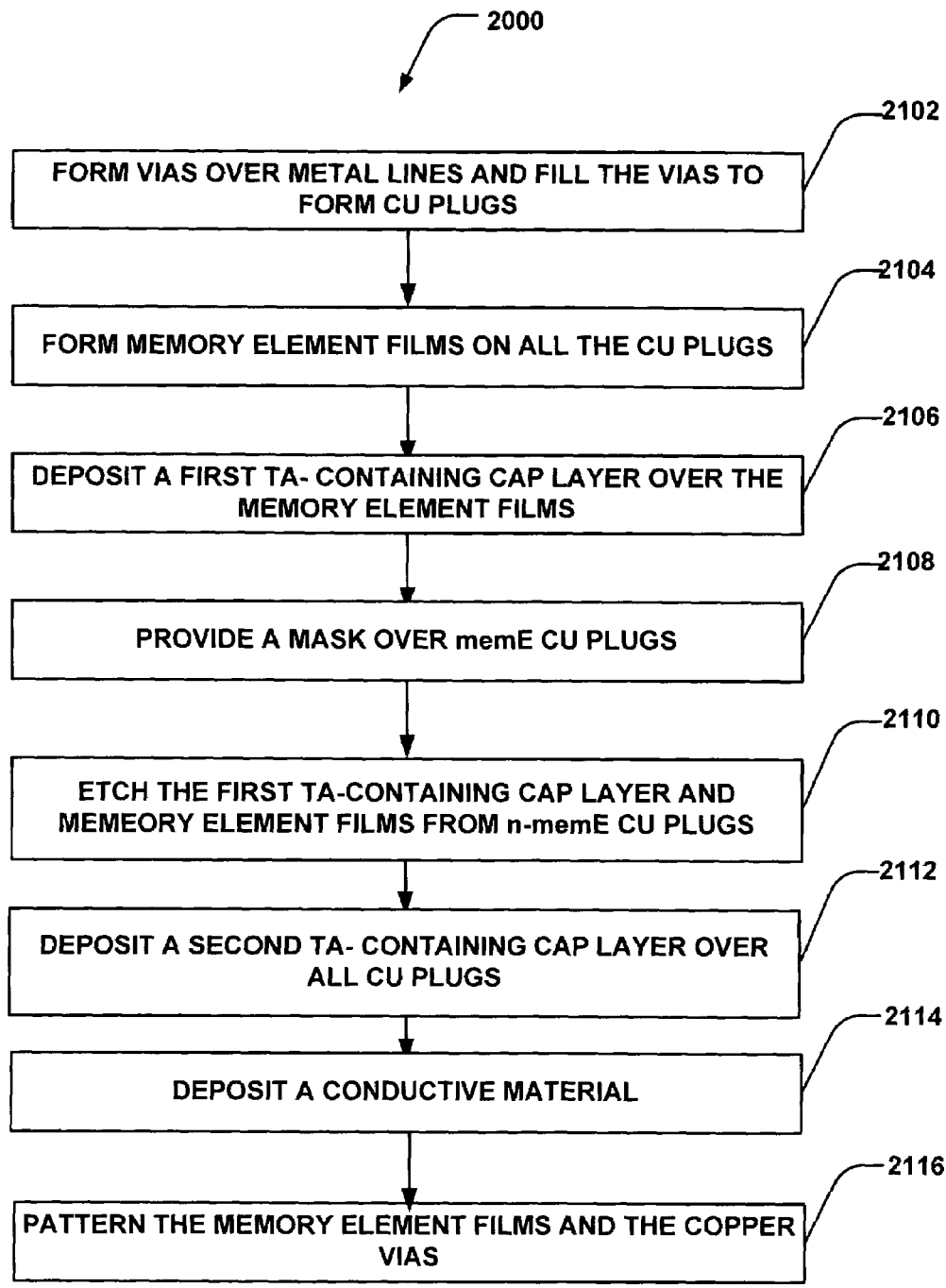
FIG. 20 is a flow chart illustrating an exemplary methodology for carrying out one aspect of the subject invention.

Referring to FIG. 20, a flow chart of an exemplary methodology 2000 for carrying out an aspect of the subject invention is shown. The method 2000 involves forming vias over metal lines and filling the vias to form Cu plugs (act 2102), forming memory element films over substantially all the Cu plugs (act 2104), depositing a first Ta-containing cap layer over substantially all memory element films (act 2106), protecting memE Cu plugs with a mask (act 2108), removing the first Ta-containing cap layer and the memory element films from non-memE Cu plugs (act 2110), depositing a second Ta-containing cap layer over both the memE Cu plugs and the non-memE Cu plugs (act 2112), depositing a conductive material (act 1214) and patterning the memory element films and the Cu vias (act 2116). This embodiment can be used to form interconnect structures concurrently in core and periphery regions.

Figure 21:
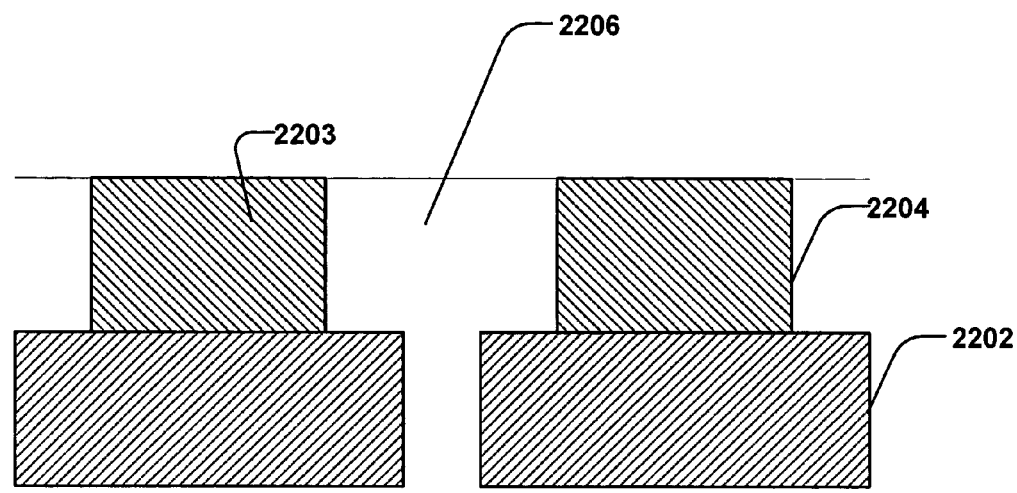
FIGS. 21–29 are cross sectional illustrations of a semiconductor substrate of a semiconductor device undergoing fabrication according to one aspect of the subject invention.
Figure 22:
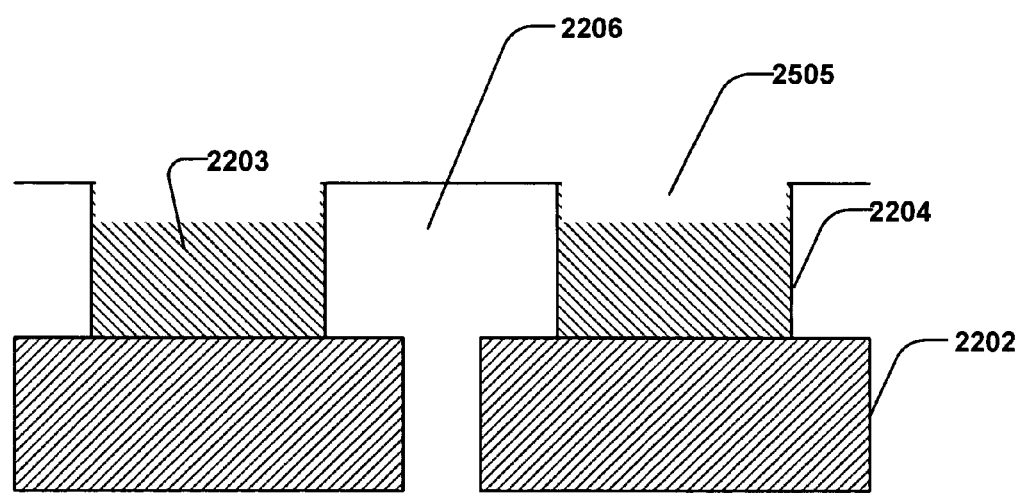
Figure 30:
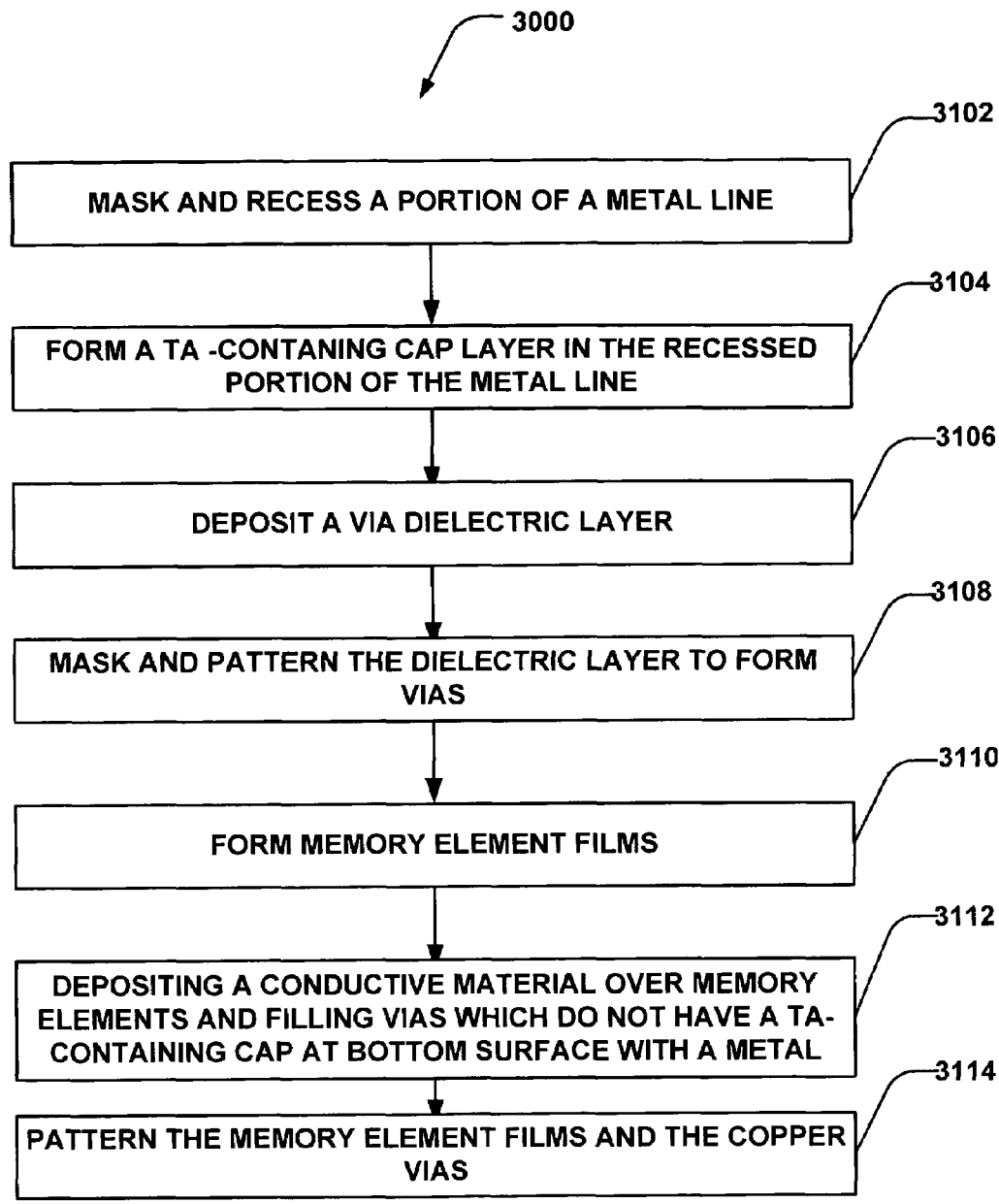
FIG. 30 is a flow chart illustrating an exemplary methodology for carrying out one aspect of the subject invention.

Referring to FIG. 30, act 2102 is forming vias over metal lines. FIG. 21 is a cross sectional illustration of a semiconductor device undergoing fabrication, showing metal lines 2202, a dielectric layer 2206, vias 2204 and Cu plugs 2203. The methods and materials of forming the metal lines 2202, the dielectric layer 2206, the vias 2204, and the Cu plugs 2203 are similar both in method and in material to those described for method 100 and therefore, are not described here. The Cu plugs 2203 are recessed to expose fresh Cu. The Cu recessing is described before and not repeated for brevity. FIG. 22 is a cross sectional illustration of a semiconductor device undergoing fabrication and shows recessed surfaces of Cu 2505.

Figure 23:
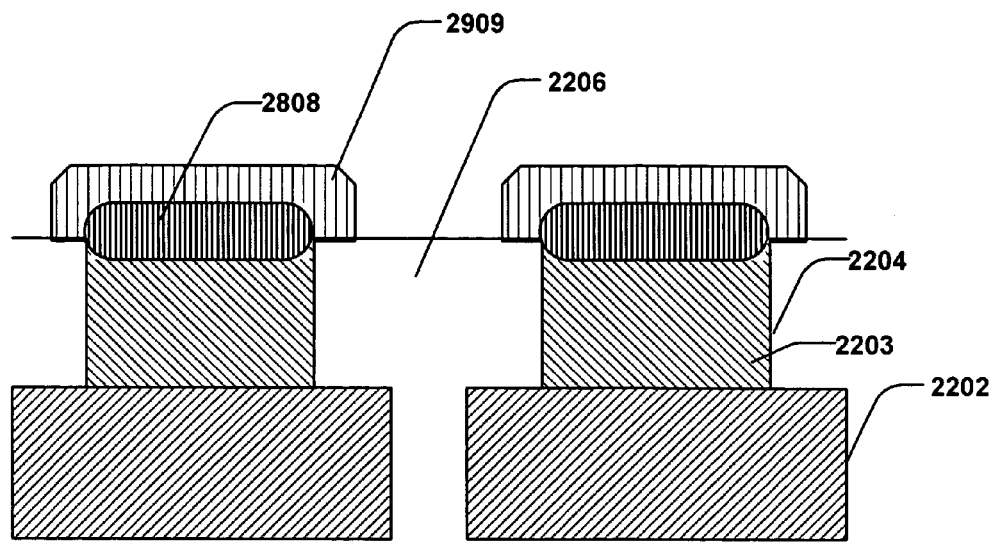

Referring back to FIG. 20, act 2104 is forming memory element films over the recessed surface of Cu plugs. The formation of memory element films described previously for method 100 can be followed to carry out act 2104. FIG. 23 is a cross sectional illustration of a semiconductor device undergoing fabrication according to method 2000, and shows memory element films, passive layers 2808 and active layers 2909 on all of the Cu plugs.

Figure 24:
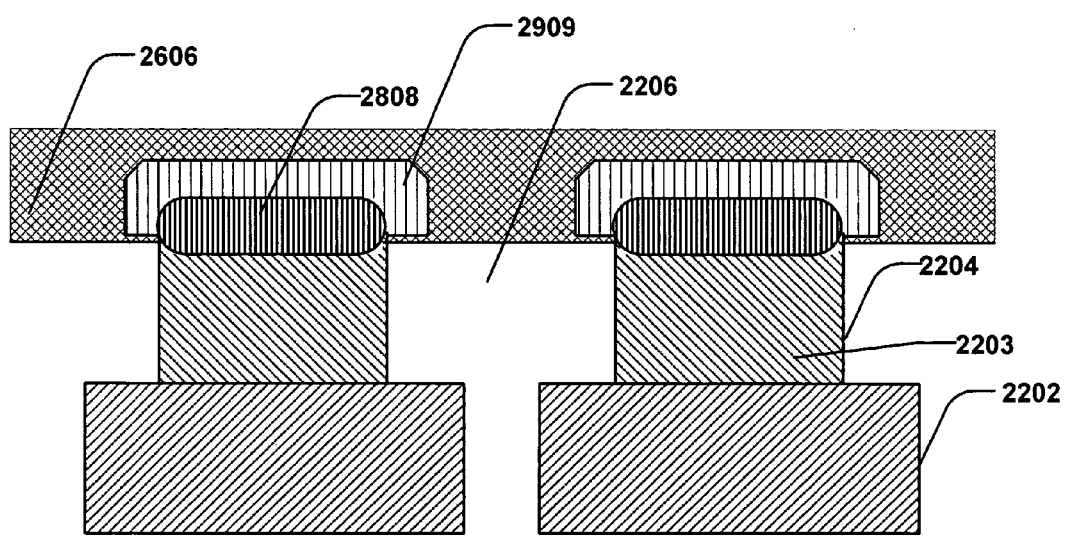

Referring back to FIG. 20, act 2106 is depositing a first Ta-containing cap layer over substantially the entire upper surface of memory element films and the upper surface of the dielectric layer 2206. Act 2106 is similar to act 106 of method 100. FIG. 24 is a cross sectional illustration of a semiconductor device undergoing fabrication according to method 2000 and shows a first Ta-containing cap layer 2606 over substantially all the upper surfaces of the dielectric layer 2206 including the upper surface of the memory element films.

Figure 25:
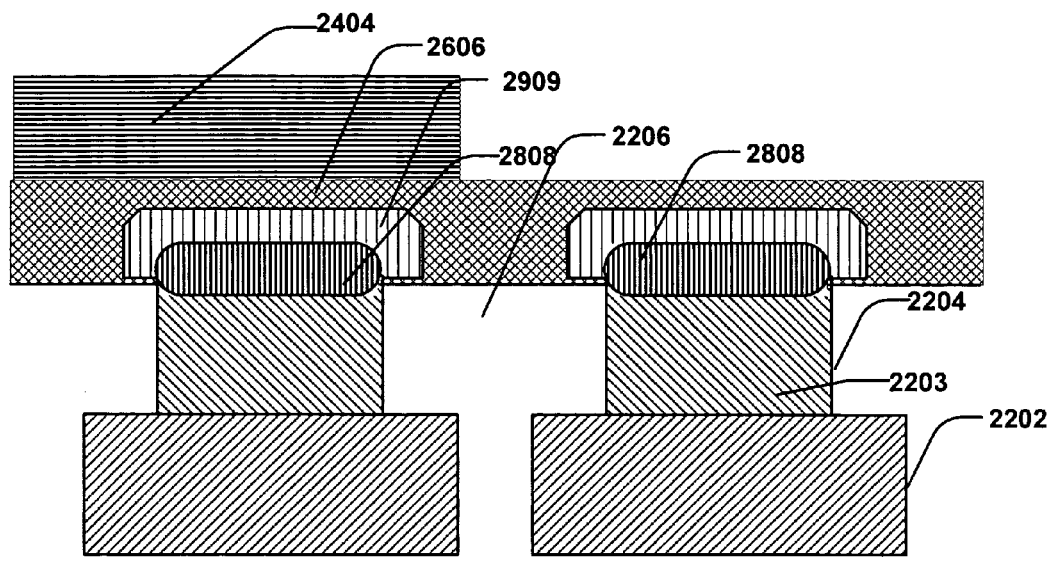

Referring back to FIG. 20, act 2108 is providing an etch mask over memE Cu plugs. The etch mask can be any resists available commercially. FIG. 25 is a cross sectional illustration of a semiconductor device undergoing fabrication according to method 2000 and shows an etch mask 2404 over a memE Cu plug.

Figure 26:
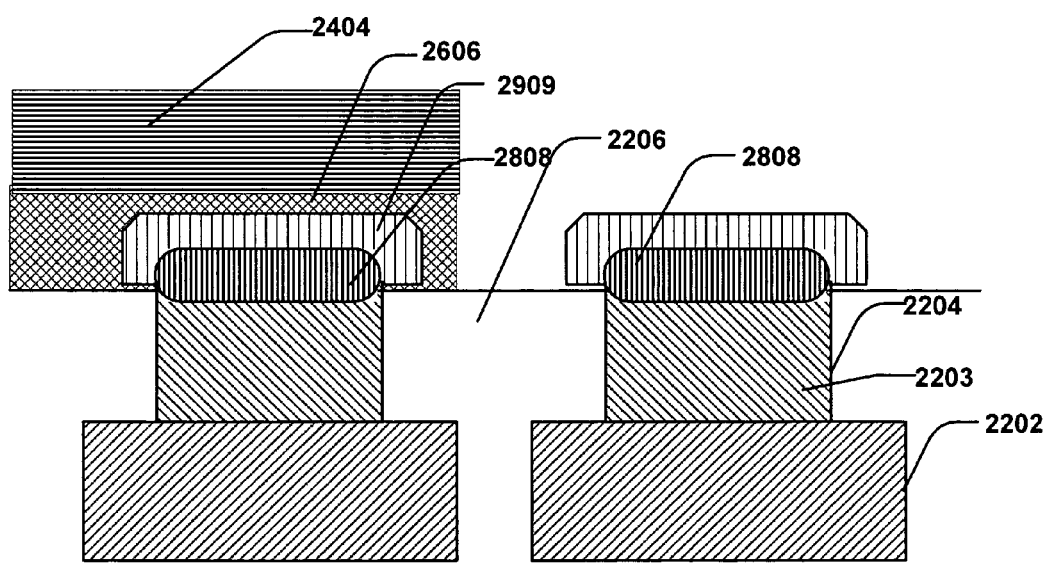

Referring back to FIG. 20, act 2110 is etching the first Ta-containing cap layer 2606 and the selected memory element films from non-memE Cu plugs. The etching of the first Ta-containing cap layer can be by any suitable means. For example, the etching of the first Ta-containing cap layer can be by a wet chemical etch using a peroxide based etchant. Etching of the Ta-containing cap layer described earlier in the subject specification can be used for carrying out act 2110. FIG. 26 is a cross sectional illustration of a semiconductor device undergoing fabrication according to method 2000 and shows the unetched portion of the first Ta-containing cap layer 2606 under the etch mask 2404.

Figure 27:
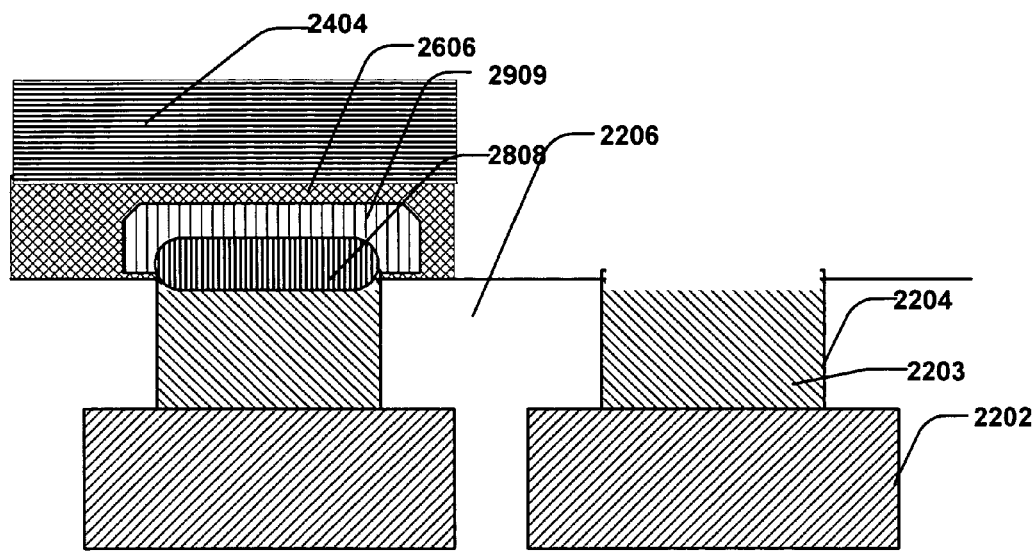

The removal of memory element films can be by any suitable method. For example, the active layer 2909 can be removed using oxygen containing plasma or a wet chemical cleaning using materials such as ACT 970. The passive layer 2808 is removed using any suitable technique. For example etching or sputtering can be used to remove the passive layer 2808. FIG. 27 is a cross sectional illustration of a semiconductor device undergoing fabrication according to method 2000, showing a structure wherein the memory element films are removed from non-memE Cu plugs.

The order and sequence of the removal of the first Ta-containing cap layer and the memory element films can be varied depending on the procedures employed for the removal. In one embodiment of the subject invention, both the first Ta-containing cap layer 2606 and the memory element films, the passive layer 2808 and the active layer 2909 are removed in a single operation. In another embodiment of the subject invention, the removal of the first Ta-containing cap layer 2606 is carried out separately from the removal of the memory element films, the passive layer 2808 and the active layer 2909. In yet another embodiment of the subject invention, the passive layer 2808 and the active layer 2909 of the memory element films are removed in a single operation.

Figure 28:
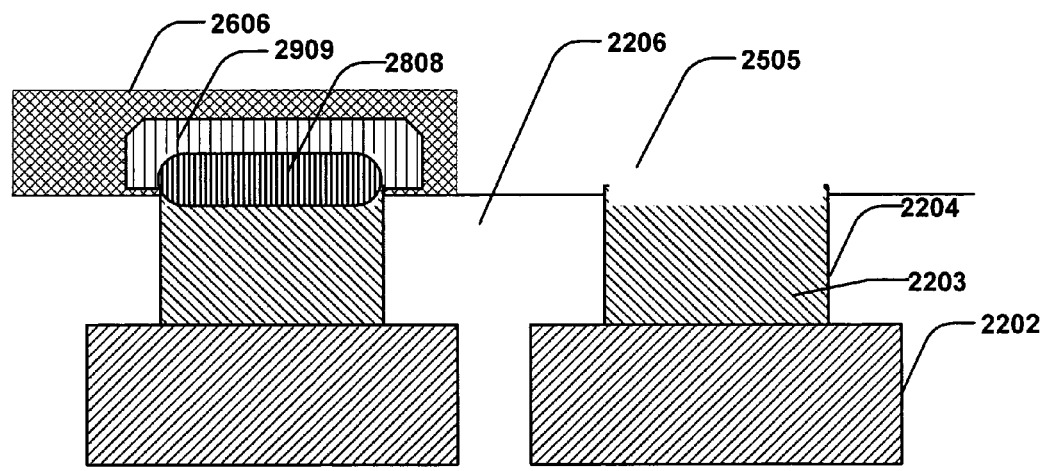

The resist 2404 is stripped resulting in memE Cu plugs with a Ta-containing cap. FIG. 28 is a cross sectional illustration of a semiconductor device undergoing fabrication according to method 2000 and shows memory element films with the Ta-containing cap on memE Cu plugs.

Referring back to FIG. 20, act 2112 is depositing a second Ta-containing cap layer over the non-memE Cu plugs. The second Ta-containing cap layer also covers the surface of the first Ta-containing cap on the memE Cu plugs. The techniques and methods for forming the second Ta-containing cap layer are similar to the formation of the first Ta-containing cap layer 2606. The second Ta-containing cap layer forms a Ta-containing cap over the non-memE Cu plugs.

Figure 29:
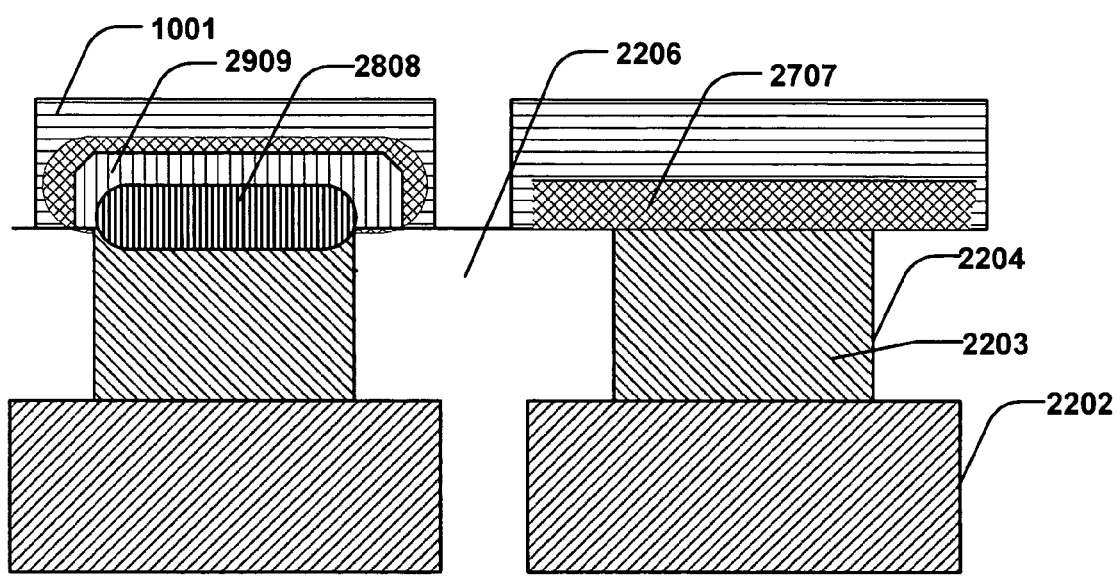

Referring back to FIG. 20, acts 2114 and 2116 are depositing a conductive material and patterning the memory element films and the Cu vias respectively. Acts 2114 and 2116 can be similar to acts 112 and 114 of method 100, and therefore are not described here. FIG. 29 is a cross sectional illustration of a semiconductor device undergoing fabrication according to method 2000 and shows a conductive material 2001 over the Ta-containing cap 2707.

Referring to FIG. 30, a flow chart of an exemplary methodology 3000 for carrying out an aspect of the subject invention is shown. The method 3000 involves recessing a portion of a metal line (act 3102), forming a Ta-containing cap layer in the recessed portion of the metal line (act 3104), depositing a dielectric layer (act 3106), patterning the dielectric layer to form a via (act 3108), depositing memory element films (act 3110), depositing a conductive material over memory elements and filling vias which do not have a Ta-containing cap at bottom surface with a metal (act 3112), and patterning the memory element films and the Cu vias (act 3114). This aspect of the invention can advantageously reduce the number of masks used in forming an integrated structure.

Figure 31:
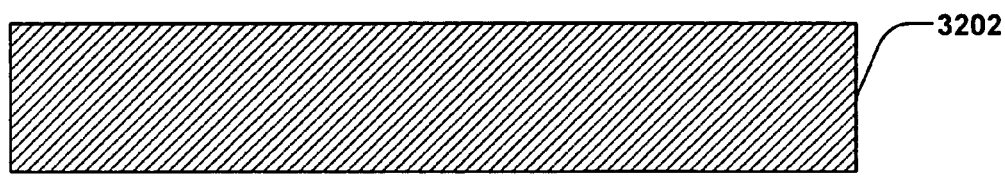
FIGS. 31–37 are cross sectional illustrations of a semiconductor substrate of a semiconductor device undergoing fabrication according to one aspect of the subject invention.

Referring to FIG. 30, act 3102 is recessing a portion of a metal line 3202 where non-memE Cu plugs will be placed. The forming of the metal line 3202 is similar to the forming of the metal line 202. FIG. 31 shows the metal line 3202. Any suitable etch mask layer can be used for protecting portions of metal line surfaces from etching. For example a resist can be used as an etch mask. Any commercially available resist can be used to cover the selected areas of the metal line.

Figure 32:
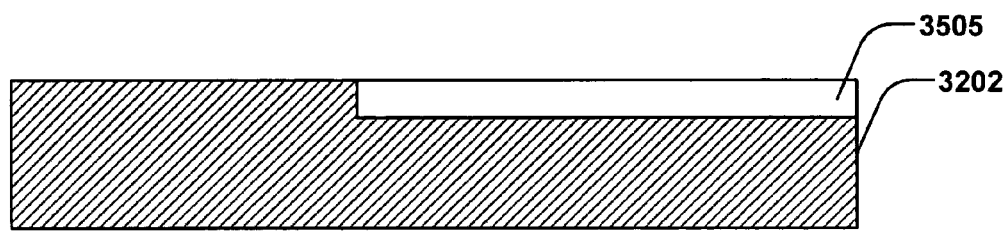

The techniques used for recessing the metal line 3202 are similar to the techniques used for recessing copper during act 104 of method 100. The amount of metal to be recessed depends on the design and lithographic needs. In one embodiment of the subject invention, the metal line 3202 is recessed to a depth from about 10 Å to about 1000 Å. Optionally, polishing and cleaning acts are performed to remove any undesirable material from the surface. FIG. 32 is a cross sectional illustration of a semiconductor substrate undergoing fabrication according to method 3000 and shows a metal line 3202 with a recessed surface 3505.

Figure 33:
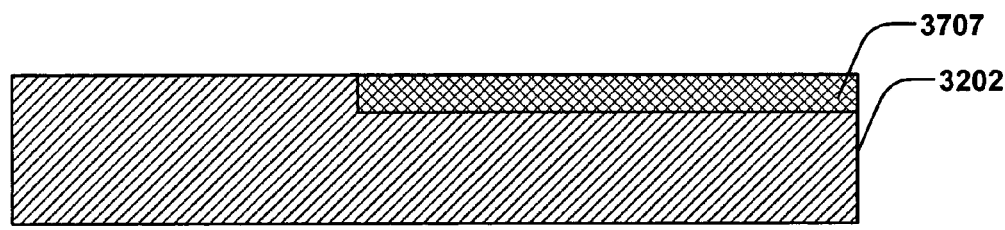

Referring back to FIG. 30, act 3104 is forming a Ta-containing cap layer 3606 in the recessed portion of the metal line 3202. The formation of the Ta-containing cap 3606 is described before while describing the act 108 of method 100, and therefore, not repeated here. The Ta-containing cap layer 3606 is polished using standard techniques to form a damascened Ta-containing cap 3707 shown in FIG. 33.

The Ta-containing cap 3707 can be of any suitable thickness. In one embodiment of the subject invention, the Ta-containing cap 3707 can have a thickness from about 1 Å to about 200 Å. In another embodiment, the thickness of the Ta-containing cap 23707 is from about 5 Å to about 50 Å. In yet another embodiment of the subject invention, the Ta-containing cap 3707 has a thickness of about 20 Å.

Figure 34:
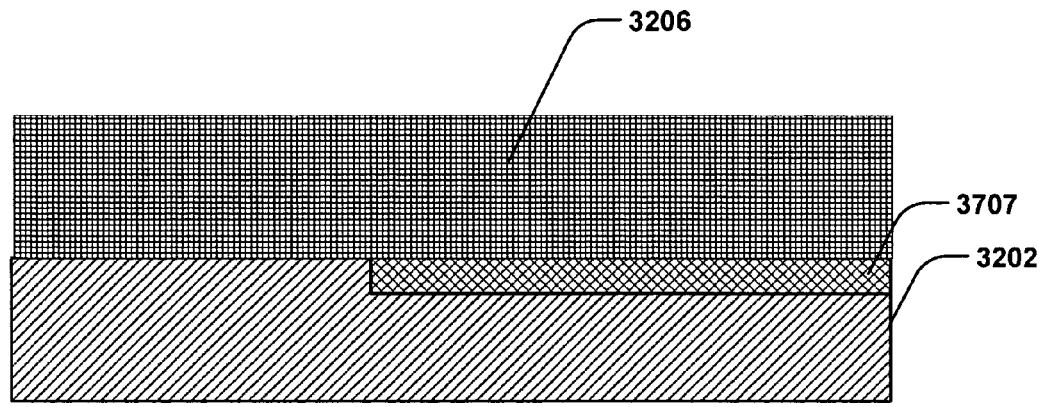

Referring back to FIG. 30, act 3106 is deposition of a dielectric layer over the metal line 3202. The formation of dielectric layer 3206 is similar to formation of the dielectric layer 206 and therefore, not described here. FIG. 34 shows the dielectric layer 3206 over the surface of the metal line 3202 with the Ta-containing cap 3707. The dielectric is deposited substantially over all the upper surface of the metal line 3202.

Figure 35:
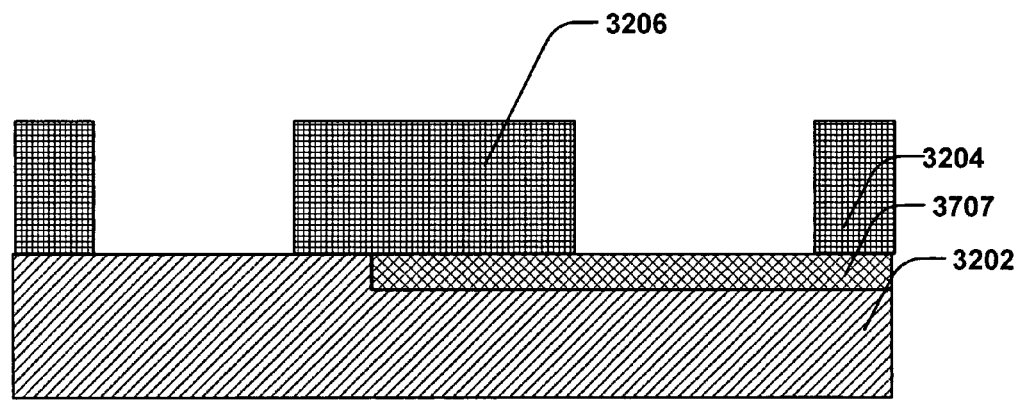

Referring back to FIG. 30, act 3108 is patterning the dielectric layer 3206 to from vias. The method and material to perform act 3108 are similar to the patterning of the dielectric layer 206 of method 100 except that in act 3108 the copper filling of vias may be omitted facilitating formation of memory element films at the bottom surface of the Cu vias. FIG. 35 is a cross sectional illustration of a semiconductor substrate undergoing fabrication according to method 3000, showing vias 3204 in the dielectric layer 3206.

Figure 36:
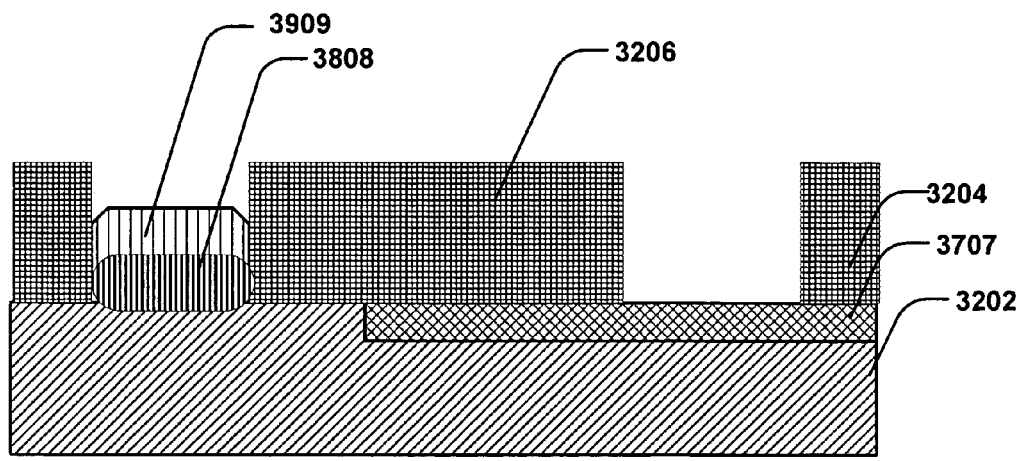

Referring back to FIG. 30, act 3110 is forming memory element films in Cu vias with no Ta-containing cap at their bottom surface. The memory element films are formed as described earlier for method 100. FIG. 36 is a cross sectional illustration of a semiconductor substrate undergoing fabrication according to method 3000 and shows memory element films, the passive layer 3808 and the active layer 3909 in vias which do not have a Ta-containing cap at their bottom surface.

Figure 37:
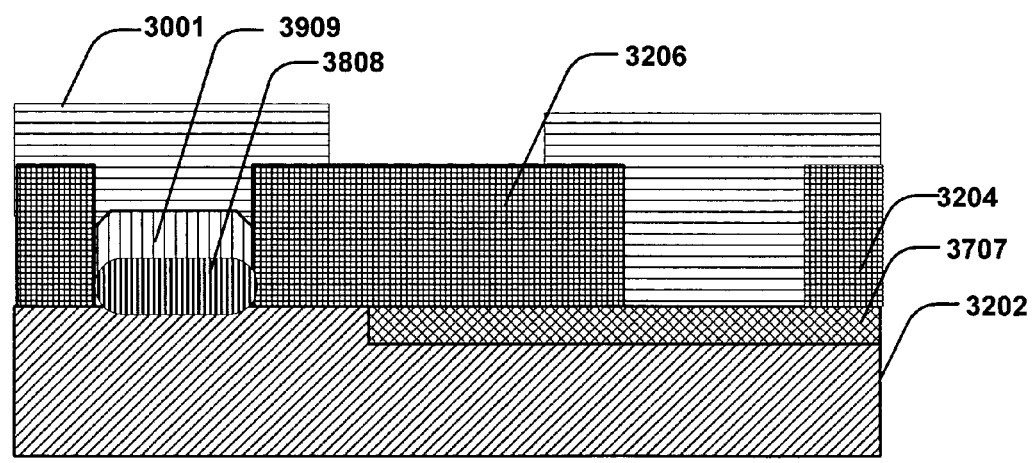

Referring back to FIG. 30, act 3112 and 3114 are depositing a conductive material over memory element films and filling Cu vias with a metal, and patterning the memory element films and the Cu vias, respectively. Act 3112 involves deposition of a conductive material over the memory element films and also into the vias which did not receive memory element films. Act 3112 is carried out similar to act 112 of method 100. However, prior to depositing the conductive material, the vias with no memory element films may be filled with copper using standard techniques. Optionally, polishing may be carried out to planarize the copper. FIG. 37 is a cross sectional illustration of a semiconductor substrate undergoing fabrication according to method 3000, showing the deposition of the conductive material 3001 over both the memory element films and the Cu vias. Further patterning of the conductive material 3001 to form wordlines, bit lines and interconnects is carried out according to protocols known to persons skilled in the art.

The methods described in the subject invention can be useful for any device requiring memory elements. For example, semiconducting devices with improved memory element films can be useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of organic memory devices. Examples of hand-held devices include cell phones and other two way communication devices, personal data assistants, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for concurrent formation of copper vias and memory element structures in a copper layer comprising:
   forming vias over metal lines and filling the vias to form copper plugs, wherein the copper plugs comprise memory element film forming copper plugs and non-memory element forming copper plugs;
   forming a tantalum-containing cap layer over upper surfaces of at least one of the copper plugs; and
   depositing memory element films;
   wherein the tantalum-containing cap layer prevents formation of the memory element films.

2. The method of claim 1, further comprising:
   protecting the memory element forming copper plugs with a hard mask;
   recessing a portion of the non-memory element forming copper plugs before forming the tantalum-containing cap layer; and
   removing the tantalum-containing cap layer and the hard mask from the non-memory element forming copper plugs before depositing the memory element films.

3. The method of claim 2, wherein the non-memory element forming copper plugs are recessed to a depth from about 100 Å to about 1000 Å from the upper surface of the vias.

4. The method of claim 1, further comprising:
   providing an etch mask layer over the non-memory element forming copper plugs that are covered by the tantalum-containing cap layer; and
   etching the tantalum-containing cap layer from the memory element forming copper plugs.

5. The method of claim 4, wherein etching of the tantalum-containing cap layer comprises at least one of a wet etch and a plasma etch.

6. The method of claim 1, further comprising:
   depositing the tantalum-containing cap layer over the memory element films; and
   removing the tantalum-containing cap layer and the memory element films from the non-memory element forming copper plugs.

7. The method of claim 6, wherein removing the tantalum-containing cap layer and the memory element films comprises an etch.

8. The method of claim 1, further comprising:
   recessing a portion of the metal lines before forming the vias; and
   forming the tantalum-containing cap layer over the recessed portion of the metal lines.

9. The method of claim 1, wherein the tantalum-containing cap layer comprises alpha tantalum.

10. The method of claim 1, wherein the tantalum-containing cap layer comprises at least one selected from the group consisting of beta tantalum, compounds of tantalum, and alloys of tantalum.

11. The method of claim 1, wherein the tantalum-containing cap layer comprises at least one selected from the group consisting of tantalum nitride, tantalum carbide, tantalum oxide, tantalum chloride, tantalum bromide, tantalum sulfide, tantalum-titanium, and tantalum-tungsten.

12. The method of claim 1, wherein the memory element films comprise at least one passive layer and at least one active layer.

13. The method of claim 12, wherein the passive layer comprises copper sulfide.

14. The method of claim 12, wherein the active layer comprises a semiconducting polymer.

15. The method of claim 1, further comprising depositing a conductive material and patterning the memory element films and the copper vias.

16. The method of claim 15, wherein the conductive material comprises aluminum.

17. The method of claim 15, wherein the conductive material over memory element films is patterned to form an electrode.

18. The method of claim 15, further comprising a diffusion barrier layer between the memory element films and the conductive material.

19. A method for forming memory element films over selective copper plugs comprising:

forming vias over metal lines and filling the vias to form copper plugs, wherein the copper plugs comprise memory element film forming copper plugs and non-memory element forming copper plugs;

depositing the memory element films substantially over all the copper plugs;

depositing a tantalum-containing cap layer over the memory element films;

protecting the memory element films on the memory element forming copper plugs with an etch mask;

removing the tantalum-containing cap layer and the memory element films from the non-memory element forming copper plugs; and patterning the memory element films and the copper vias.

20. A method for fabricating memory element structures and copper vias in a single copper layer comprising:

forming a metal line;

recessing a portion of the metal line;

forming a tantalum-containing cap layer over the recessed portion of the metal line;

forming vias over the metal line;

depositing the memory element films in the vias; and patterning the copper vias and the memory element films.

* * * * *